US009335606B2

(12) United States Patent
Hanson et al.

(10) Patent No.: US 9,335,606 B2
(45) Date of Patent: May 10, 2016

(54) DEVICE FOR ACHIEVING MULTI-PHOTON INTERFERENCE FROM NITROGEN-VACANCY DEFECTS IN DIAMOND MATERIAL

(71) Applicant: Element Six Technologies Limited, London (GB)

(72) Inventors: Ronald Hanson, Delft (NL); Hannes Bernien, Delft (NL); Matthew Lee Markham, Didcot (GB); Daniel James Twitchen, Santa Clara, CA (US)

(73) Assignee: Element Six Technologies Limited, Didcot (GB)

( * ) Notice: Subject to any disclaimer, the term of this patent is extended or adjusted under 35 U.S.C. 154(b) by 98 days.

(21) Appl. No.: 14/349,535
(22) PCT Filed: Oct. 12, 2012
(86) PCT No.: PCT/EP2012/070309
§ 371 (c)(1),
(2) Date: Apr. 3, 2014
(87) PCT Pub. No.: WO2013/053911
PCT Pub. Date: Apr. 18, 2013

(65) Prior Publication Data
US 2014/0291490 A1 Oct. 2, 2014

Related U.S. Application Data

(60) Provisional application No. 61/547,444, filed on Oct. 14, 2011, provisional application No. 61/642,577, filed on May 4, 2012.

(30) Foreign Application Priority Data

Oct. 14, 2011 (GB) .................................. 1117749.0
May 4, 2012 (GB) .................................. 1207885.3

(51) Int. Cl.
*G02F 3/00* (2006.01)
*B82Y 10/00* (2011.01)
(Continued)

(52) U.S. Cl.
CPC . *G02F 3/00* (2013.01); *B82Y 10/00* (2013.01); *B82Y 20/00* (2013.01); *G02B 6/00* (2013.01);
(Continued)

(58) Field of Classification Search
CPC .................................. G02F 3/00; G06N 99/002
USPC ......... 250/214.1, 214 R, 458.1, 461.1, 461.2, 250/459.1, 363.01; 356/318, 328, 334; 257/12–14, 25
See application file for complete search history.

(56) References Cited

U.S. PATENT DOCUMENTS 8,314,405 B2 * 11/2012 Kim ................... G01N 21/6408
250/458.1

FOREIGN PATENT DOCUMENTS

| WO | 2010/010344 A1 | 1/2010 |
| WO | 2010/010352 A1 | 1/2010 |
| WO | 2012/082938 A1 | 6/2012 |

OTHER PUBLICATIONS

International Search Report for PCT/EP2012/070309 dated Feb. 25, 2013.

(Continued)

*Primary Examiner* — Que T Le
(74) *Attorney, Agent, or Firm* — Armstrong Teasdale LLP

(57) ABSTRACT

A device for achieving multi-photon interference is provided based on nitrogen-vacancy defects in diamond material. Nitrogen-vacancy defects having a narrow band width and a similar emission frequency are identified within a high quality diamond material. The device has an excitation arrangement configured to individually address nitrogen-vacancy defects and optical outcoupling structures for increasing outcoupling of photons from each nitrogen-vacancy defect. A tuning arrangement is configured to tune the emission from each nitrogen-vacancy defect to reduce differences in frequency and the photons are overlapped. A detector is provided to detect the photon emissions. The detector is configured to resolve sufficiently small differences in photon detection times such that tuned photon emissions from the nitrogen-vacancy defects are quantum mechanically indistinguishable resulting in quantum interference between indistinguishable photon emissions from different nitrogen-vacancy defects.

18 Claims, 8 Drawing Sheets

(51) Int. Cl.
  *G06N 99/00* (2010.01)
  *H01L 29/66* (2006.01)
  *H01L 29/12* (2006.01)
  *B82Y 20/00* (2011.01)
  *G02B 6/00* (2006.01)

(52) U.S. Cl.
  CPC ............ *G06N 99/002* (2013.01); *H01L 29/127* (2013.01); *H01L 29/66977* (2013.01); *H01L 29/66984* (2013.01)

(56) References Cited

OTHER PUBLICATIONS

Search Report for GB1117749.0 dated Feb. 14, 2012.
Search Report for GB11218347.1 dated Jan. 9, 2013.
Neumann et al., "Multipartite Entanglement Among Single Spins in Diamond," Science, 320, 1326-1329, 2008.
Neumann et al., "Single-Shot Readout of a Single Nuclear Spin," Science, 329, 542-544, 2010.
Siyushev et al., "Monolithic diamond optics for single photon detection," Applied Physics Letters, 97, 241902, 2010.
Tamarat et al., "Stark Shift Control of Single Optical Centers in Diamond," Phys. Rev. Lett. 97, 083002, 2006.
Patel et al., "Two-photon interference of the emission from electrically tunable remote quantum dots," Nature Photonics Letters, 4, 632-635, 2010.
Ionicioiu, "Entangling spins by measuring charge: a parity-gate toolbox," Phys. Rev. A, 75, 032339, 2007.
Raussendorf et al., "A One-Way Quantum Computer," Phys. Rev. Lett., 86, 5188-5191, 2001.
Olmschenk et al., "Quantum Teleportation Between Distant Matter Quibits," Science, 323, 486-489, 2009.
Sanaka et al., "Indistinguishable Photons from Independent Semiconductor Nanostructures," Phys. Rev. Lett., 103, 053601, 2009.
Legero et al., "Quantum Beat of Two Single Photons," Phys. Rev. Lett. 93, 070503, 2004.
Legero et al., "Time-Resolved Two-Photon Quantum Interference," Appl. Phys. B, 77, 797, 2003.
Mao et al., "Mesoscopic Quadratic Quantum Measurements," Phys. Rev. Lett. 93, 056803, 2004.
Beenakker et al., "Charge detection enables free-electron quantum computation," Phys. Rev. Lett., 93, 020501, 2004.
Gottesman et al., "Demonstrating the viability of universal quantum computation using teleportation and single-qubit operations," Nature, 402, 390, 1999.
Sipahigil et al., "Quantum interference of single photons from remote nitrogen-vacancy centers in diamond," Phys. Rev. Lett. 108, 143601, 2012.
Blinov et al., "Obsercation of entanglement between a single trapped atom and a single photon," Nature, 428, 153, 2004.
Buckley et al., "Spin-Light Coherence for Single-Spin Measurement and Control in Diamond," Science, 320, 1212, 2010.
Smeltzer et al., "13C hyperfine interactions in the nitrogen-vacancy centre in diamond," New Journal of Physics, 13, 025021, 2011.
Trauzettel et al., "Parity meter for charge qubits: an efficient quantum entangler," Phys. Rev. B, 73, 235331, 2006.
Hong et al., "Measurement of Subpicosecond Time Intervals between Two Photons by Interference," Phys. Rev. Lett. 59, 2044, 1987.
Chou et al., "Measurement-Induced Entanglement for Excitation Stored in Remote Atomic Ensembles," Nature, 438, 828, 2005.
Moehring et al., "Entanglement of single-atom quantum bits at a distance," Nature, 449, 68, 2007.
Matsukevich et al., "Bell inequality violation with two remote atomic quibits," Phys. Rev. Lett., 100, 150404, 2008.

Knill et al., "A scheme for efficient quantum computation with linear optics," Nature, 409, 46, 2001.
Togan et al., "Quantum entanglement between an optical photon and a solid-state spin qubit," Nature, 466, 730, 2010.
Kaiser et al., "Polarization properties of single photons emitted by nitrogen-vacancy defect in diamond and low temperature," arXiv:0906.3426 [quant-ph], 2009.
Flagg et al., "Interference of Single Photons from Two Separate Semiconductor Quantum Dots," Phys. Rev. Lett., 104, 137401, 2010.
Balasubramanian et al., "Ultralong spin coherence time in isotopically engineered diamond," Nature Materials, 8, 383, 2009.
de Lange et al., "Universal Dynamical Decoupling of a Single Solid-State Spin from a Spin Bath," Science, 330, 60, 2010.
Waldherr et al., "Dark States of Single Nitrogen-Vacancy Centers in Diamond Unraveled by Single Shot NMR," Phys. Rev. Lett. 106, 157601, 2011.
Engel et al., "Fermonic Bell-State Analyzer for Spin Qubits," Science, 309, 586, 2005.
Aharanovich et al., "Diamond photonics," Nature Photonics, 5, 397405, 2011.
Hadden et al., "Strongly enhanced photon collection from diamond defect centres under micro-fabricated integrated solid immersion lenses," Appl. Phys. Lett, 97, 241901, 2012.
Maze et al., "Properties of nitrogen-vacancy centers in diamond: the group theoretic approach," New Journal of Physics, 13, 025025, 2011.
Lalumiere et al., "Tunable joint measurements in the dispersive regime of cavity QED," Phys. Rev. A, 81, 040301, 2010.
Fu et al., "Observation of the Dynamic Jahn-Teller Effect in the Excited States of Nitrogen-Vacancy Centers in Diamond," Phys. Rev. Lett. 103, 256404, 2009.
Bassett et al., "Electrical Tuning of Single Nitrogen-Vacancy Center Optical Transitions Enhanced by Photoinduced Fields," Phys. Rev. Lett. 107, 266403, 2011.
Childress et al., "Fault-Tolerant Quantum Communication Based on Solid-State Photon Emitters," Phys. Rev. Lett. 96, 070504, 2006.
Jiang et al., "Coherence of an Optically Illuminated Single Nuclear Spin Qubit," Phys. Rev. Lett., 100, 073001, 2008.
Duan et al., "Long-distance quantum communication with atomic ensembles and linear optics," Nature, 414, 413, 2001.
Robeldo et al., "Control and coherence of the optical transition of single defect centers in diamond," Phys. Rev. Lett. 105, 177403, 2011.
Nielsen et al., "Quantum Computation and Quantum Information," Cambridge Unversity Press 2000, pp. 1-29.
Rowe et al., "Experimental violation of a Bell's inequality with efficient detection," Nature, 409, 791, 2001.
Ansmann et al., "Violation of Bell's inequality in Josephson phase qubits," Nature, 461, 504, 2009.
Riebe et al., "Deterministic entanglement swapping with an ion-trap quantum computer," Nature Physics, 4, 839, 2008.
Dutt et al., "Quatnum Register Based on Individual Electronic and Nuclear Spin Qubits in Diamond," Science, 316, 1312, 2007.
Manson et al., "Nitrogen-vacancy center in diamond: Model of the electronic structure and associated dynamics," Phys Rev. B 74, 104303, 2006.
Bernien et al., "Two-Photon Quantum Interference from Separate Nitrogen Vacancy Centers in Diamond," Phys. Rev. Lett. 108, 043604, 2012.
Jones et al., "Photon frequency-mode matching using acousto-optic frequency beam splitters," Phys. Rev. A, 73, 033813, 2006.
Lettow et al., "Quantum Interference of Tunably Indistinguishable Photons from Remote Organic Molecules," Phys. Rev. Lett. 104, 123605, 2010.
Lettow et al., "Realization of two Fourier-limited solid-state single-photon sources," Optics Express, 15, 15842, 2007.
Robeldo et al., "High-fidelity projective read-out of a solid-state spin quantum register," Nature, 477, 574, 2011.

\* cited by examiner

DEVICE FOR ACHIEVING MULTI-PHOTON INTERFERENCE FROM NITROGEN-VACANCY DEFECTS IN DIAMOND MATERIAL

FIELD OF INVENTION

The present invention relates to a quantum processing device and more particularly a solid state quantum processing device. Certain aspects of the present invention also relate to a solid state component for use in quantum processing devices and a method of fabricating such solid state components.

BACKGROUND OF INVENTION

Multi-photon quantum interference from multiple photon emitters is considered to be a key ingredient for certain quantum processing applications. To achieve such interference requires the photons from different emitters to be quantum mechanically indistinguishable.

Multi-photon quantum interference from multiple gas state emitters, including emission from a single atom/ion in a trap, is known. This is achieved by generating photon emission from gas state emitters which is identical in terms of bandwidth, frequency, and polarization such that photons from different emitters are quantum mechanical indistinguishable. These identical photons can then be overlapped in a beamsplitter to achieve quantum interference.

The aforementioned approach is problematic for solid state emitters. This is because the energies of optical transitions in solid state systems vary due to different strain environments. Differences in emission characteristics of solid state emitters may be caused by impurities and/or intrinsic crystal defects such as dislocations. As such, photons emitted from two different solid state emitters vary in terms of bandwidth, frequency, and polarization and are quantum mechanically distinguishable. Accordingly, such photons do not undergo quantum interference when overlapped on a beamsplitter or comparable arrangement.

One solution to the aforementioned problem is to reduce the resolution of a detector arrangement used to detect photons from photon emitters to an extent that the photons from different sources are indistinguishable to the detectors. For example, by using detectors with a high time resolution this in turn leads to a low frequency resolution which can render the photons indistinguishable. However, single photon emission from defects in solid state materials can be very weak. For example, the photon emissive nitrogen-vacancy defect (NV$^-$) in diamond material, which is a leading candidate for solid state quantum processing applications, exhibits a broad spectral emission associated with a Debye-Waller factor of the order of 0.05, even at low temperature. Emission of single photons in the Zero-Phonon Line (ZPL) is then extremely weak, typically of the order of a hundred thousand of photons per second. Furthermore, due to emission losses only approximately 1% of this emission is typically detected resulting in low count rates. Such count rates are insufficient for the realization of advanced quantum information processing protocols within reasonable data acquisition times based on photon interference using high time resolution. (i.e. low frequency resolution) detectors.

In fact, the aforementioned issues are so problematic that multi-photon quantum interference from multiple solid state quantum registers has not been demonstrated in practice to date. In this regard, it should be noted that a solid state quantum register comprises both nuclear and electron spins coupled together. An electron spin can function as a control qubit with optical spin state detection and fast high fidelity coherent manipulation. A nuclear spin can function as a memory qubit which has weak interaction with the surrounding environment. Together, an electron spin and a nuclear spin coupled can form a quantum register. An example of such a quantum register is a nitrogen-vacancy defect in diamond material which has resolvable electron spin states which are optically addressable and coupled to nuclear spin states of the nitrogen nucleus and/or $^{13}$C nuclei in the surrounding diamond lattice. It should be noted that a quantum register of this kind differs from systems which only comprise single spin emitters, decoupled spin states, or emitters which do not comprise spin states which can be resolved to function as a quantum register.

In relation to the above, it is noted that multi-photon interference has been observed from more simple solid state systems such as quantum dots, single molecules adsorbed onto a surface, and F-dopants in ZnSe [see, for example, R. Lettow et al., Physical Review Letters 104 (2010); Patel et al., Nature Photonics 2010, DOI: 10.1038/NPHOTON.2010.161; Sanaka et al., PRL 103, 053601 (2009); and Flagg et al., Phys. Rev. Lett. 104, 137401 (2010)]. However, multi-photon quantum interference from multiple spin resolved solid state quantum registers has not been demonstrated in practice to date due to the previously described problems. Quantum dots in III-V semiconductors relate only to electronic transitions and thus are unsuitable for quantum information processing applications requiring a nuclear spin memory qubit. Single molecules adsorbed onto a surface do not exhibit spin resolved emission suitable for information processing. Furthermore, surface crystallized single molecule systems are inherently fragile systems which may be unsuitable for commercial device applications. F-dopants in ZnSe have not been demonstrated to comprise spin resolved solid state quantum registers in which resolvable electron spin states are coupled to one or more nuclear spins.

Accordingly, there is a need to provide a device which is capable of providing multi-photon quantum interference from multiple solid state quantum registers, particularly in reasonable data acquisition times.

SUMMARY OF INVENTION

A number of features have been identified as being required in combination in order to solve the aforementioned problems identified in the background section:
  (i) solid state material which is highly uniform such that photon emission from different solid state quantum registers is reasonably close in terms of bandwidth, frequency and polarization;
  (ii) means of tuning the photon emission from different solid state quantum registers until it is even closer in terms of frequency and preferably a filtering arrangement for reducing bandwidth and/or differences in polarization;
  (iii) means of detecting the tuned (and preferably filtered) photon emission from different solid state quantum registers which has a sufficiently poor frequency resolution (i.e. a sufficiently good time resolution) such that the photons are indistinguishable; and
  (iv) a device that permits high efficiency in photon collection so that measurements can be made at reasonable data acquisition times.

In light of the above and in accordance with a first aspect of the present invention there is provided a device for achieving multi-photon interference, said device comprising:

at least two solid state photon emitters, each solid state photon emitter comprising nuclear and electron spin states coupled together, each solid state photon emitter being configured to produce photon emission comprising a photon emission peak, wherein the photon emission peaks from different solid state photon emitters have a first frequency difference between peak intensities, and wherein the electron spin states of each solid state photon emitter are resolvable;

an excitation arrangement configured to individually address the at least two solid state photon emitters;

a plurality of optical outcoupling structures wherein each solid state photon emitter is provided with an associated optical outcoupling structure;

a tuning arrangement configured to reduce the first frequency difference between the peak intensities of the photon emission peaks from the at least two solid state photon emitters to a second frequency difference which is smaller than the first frequency difference;

a photon interference arrangement configured to overlap photon emissions from the at least two solid state emitters after tuning; and a detector arrangement configured to detect photon emissions from the at least two solid state emitters after tuning and passing through the photon interference arrangement, wherein the detector arrangement is configured to resolve sufficiently small differences in photon detection times that tuned photon emissions from the at least two solid state emitters are quantum mechanically indistinguishable resulting in quantum interference between indistinguishable photon emissions from different solid state photon emitters.

In accordance with a second aspect of the present invention there is provided a solid state component comprising:

at least two solid state photon emitters, each solid state photon emitter comprising nuclear and electron spin states coupled together, each solid state photon emitter being configured to produce photon emission comprising a photon emission peak, wherein the photon emission peaks from different solid state photon emitters have a first frequency difference between peak intensities, and wherein the electron spin states of each solid state photon emitter are resolvable;

a plurality of microwave strips wherein each solid state photon emitter is provided with an associated microwave strip for selectively manipulating an electron spin state of the solid state emitter;

a tuning arrangement configured to apply an electric field to one or more of the plurality of solid state photon emitters to compensate for frequency differences between the plurality of solid state photon emitters and bring the photon emission peaks into resonance; and a plurality of outcoupling structures wherein each solid state photon emitter is provided with an associated optical outcoupling structure.

In accordance with a third aspect of the present invention there is provided a method of fabricating a solid state component as described above, the method comprising:

identifying at least two solid state photon emitters, each solid state photon emitter comprising nuclear and electron spin states coupled together, each solid state photon emitter being configured to produce photon emission comprising a photon emission peak, wherein the photon emission peaks from different solid state photon emitters have a first frequency difference between peak intensities, and wherein the electron spin states of each solid state photon emitter are resolvable;

fabricating a plurality of outcoupling structures wherein each identified solid state photon emitter is provided with an associated optical outcoupling structure;

fabricating a plurality of microwave strips wherein each solid state photon emitter is provided with an associated microwave strip for selectively manipulating an electron spin state of the solid state emitter; and fabricating a tuning arrangement configured to apply an electric field to one or more of the plurality of solid state photon emitters to compensate for frequency differences between the plurality of solid state photon emitters and bring the photon emission peaks into resonance.

BRIEF DESCRIPTION OF THE DRAWINGS

For a better understanding of the present invention and to show how the same may be carried into effect, embodiments of the present invention will now be described by way of example only with reference to the accompanying drawings, in which:

FIG. 7(a) illustrates measurement in different single-qubit bases—the lines represent measurements along axes of the Bloch sphere, achieved by single-qubit rotations before readout along Z;

FIG. 7(b) illustrates measurement of |Φ⁺⟩ in different bases, as defined in FIG. 7(a) showing the probability for even correlations versus the angle between −X and the measurement basis of the 13C spin; solid lines are fits to the expected transformation behaviour;

FIG. 7(d) illustrates a histogram of readout results (240 repetitions) for |Ψ⁺⟩ and |Ψ⁻⟩ and in the Z-basis of both qubits (no rotations);

FIG. 7(e) illustrates measurement for the Bell states |Ψ±⟩ in different bases;

DETAILED DESCRIPTION OF EMBODIMENTS OF THE INVENTION

Figure 1:
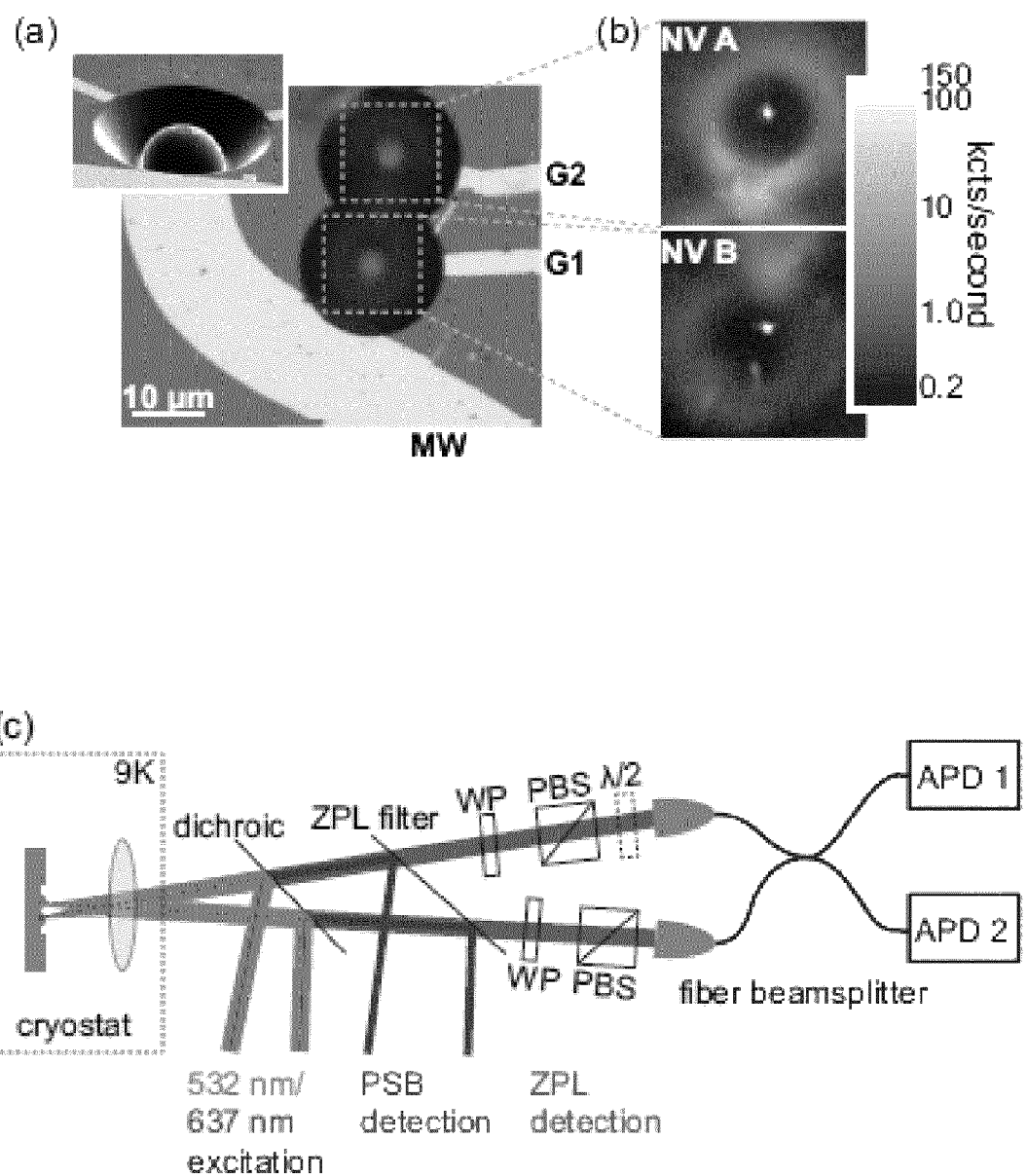
FIG. 1(a) illustrates an optical microscope image (and a scanning electron microscope image inset) of a synthetic diamond component comprising deterministically fabricated solid immersion lenses, a microwave stripline (MW) for spin manipulations, and gates (G1 and G2) for Stark tuning of optical transition energies.
FIG. 1(b) illustrates a confocal microscope image showing two NV defects (NV A and NV B)
FIG. 1(c) schematically illustrates a device configuration for achieving multi-photon interference.

As previously described in the summary of invention section, a first aspect of the present invention provides a device for achieving multi-photon interference comprising at least two solid state photon emitters. Each solid state photon emitter forms a quantum register comprising nuclear and electron spin states coupled together. Furthermore, each solid state photon emitter is configured to produce a photon emission peak. Such solid state photon emitters can be provided by a solid state material which is highly uniform such that photon emission from different solid state quantum registers is reasonably close in terms of bandwidth, frequency and polarization.

Optionally, each photon emission peak has a bandwidth which is no more than a factor of 100, 80, 60, 40, 20, 10, 5, or 1 times a natural linewidth of its associated solid state emitter. The life-time limited linewidth, or natural linewidth, is used as a basis unit and can be calculated for a particular solid state emitter having a particular emission lifetime. The natural linewidth is the linewidth that a solid state emitter would have if its optically excited state lifetime is limited solely by radiative emission. Ideally the bandwidth is low. For example, the bandwidth of each photon emission peak can be made to be no more 1 GHz, 0.5 GHz, 0.3 GHz, 0.1 GHz, 0.05 GHz, 0.01 GHz, 1000 Hz; 500 Hz, or 100 Hz by suitable materials engineering as discussed in more detail below. Such narrower emission peaks enable a large fraction of the photons to be made indistinguishable, in a quantum sense, utilizing the device structure as described herein.

Optionally, the frequency difference between two photon emission peaks from different solid state photon emitters prior to any tuning is no more than a factor of 10000, 5000, 3000, 1000, 750, or 500 times a natural line width of each of the two photon emission peaks. For example, a frequency difference between two photon emission peaks from different solid state photon emitters can be made to be more than 50 GHz, 40 GHz, 30 GHz, 20 GHz, or 10 GHz by suitable materials engineering as discussed in more detail below. Selecting solid state photon emitters having similar frequencies of emission enables the emission peaks to be tuned in such a way that a large fraction of the photons to be made indistinguishable, in a quantum sense, utilizing the device structure as described herein.

Optionally, the tuning arrangement is configured to reduce the difference between two photon emission peaks from different solid state photon emitters to no more than a factor of 100, 75, 50, 25, 10, 5, or 1 times a natural line width of each of the two photon emission peaks. For example, the tuning arrangement may be configured to reduce the difference between two photon emission peaks from different solid state photon emitters to no more than 10 GHz, 5 GHz, 4 GHz, 3 GHz, 2 GHz, 1 GHz, 0.75 GHz, or 0.5 GHz. Tuning the photon emission peaks in this manner enables a large fraction of the photons to be made indistinguishable, in a quantum sense, utilizing the device structure as described herein.

Optionally, the at least two solid state photon emitters are formed by photon emissive defects in a diamond material. Diamond material has been found to include highly stable single photon emission defects suitable for use in the present invention although in principle other materials could potentially be used to achieve the present invention. A more detailed description of suitable diamond materials and methods of manufacture is given later in this specification.

In accordance with embodiments of the present invention it is important to provide optical outcoupling structures associated with suitably similar photon emissive defects. As such, prior to forming optical outcoupling structures, at least two solid state photon emitters may be identified having a low photon emission peak bandwidth and a low frequency difference between peak intensities. The outcoupling structures may then be fabricated over, and centred on, the identified solid state photon emitters to ensure optimal outcoupling from these photon emitters. Ion beam milling may be used to form the optical outcoupling structures.

Coherent manipulation of the solid state photon emitters is achieved by applying microwave fields. In order to provide such functionality a plurality of microwave strips are fabricated on the previously described diamond component wherein each solid state photon emitter is provided with an associated microwave strip for selectively manipulating an electron spin state of the solid state emitter. In addition, the emission frequency of the solid state photon emitters can be tuned by applying an electric field to reduce the frequency difference between the peak intensities of the photon emission peaks. A tuning arrangement may be configured to reduce the frequency difference between the peak intensities of the photon emission peaks from the solid state photon emitters to thus compensating for frequency differences between the solid state photon emitters and bring the photon emission peaks into resonance. In order to achieve such functionality a tuning arrangement can be fabricated on the previously described diamond component. The tuning arrangement may be provided by a plurality of DC gates wherein each solid state photon emitter is provided with an associated dc gate to which a voltage can be applied to generate an electric field. One or both of the plurality of microwaves strips and the tuning arrangement can be formed using electron beam lithography.

Using the aforementioned approach it is possible to fabricate a solid state component comprising:

at least two solid state photon emitters, each solid state photon emitter forming a quantum register comprising nuclear and electron spin states coupled together, each solid state photon emitter being configured to produce photon emission comprising a photon emission peak, wherein the photon emission peaks from different solid state photon emitters have a first frequency difference between peak intensities, and wherein the electron spin states of each solid state photon emitter are resolvable;

a plurality of microwave strips wherein each solid state photon emitter is provided with an associated microwave strip for selectively manipulating an electron spin state of the solid state emitter;

a tuning arrangement configured to apply an electric field to one or more of the plurality of solid state photon emitters to compensate for frequency differences between the plurality of solid state photon emitters and bring the photon emission peaks into resonance; and a plurality of outcoupling structures wherein each solid state photon emitter is provided with an associated optical outcoupling structure.

The solid state photon emitters can be provided in the same piece of solid state material or in separate pieces of solid state material.

Thus far, we have described a core solid state component for use in a quantum processing device. In accordance with certain embodiments of the present invention, the surrounding device structure comprises an excitation arrangement configured to individually address the solid state photon emitters, a filtering arrangement configured to reduce the bandwidth of the photon emission from each of the solid state photon emitters and/or filter out different polarization components, a photon interference arrangement configured to overlap photon emissions from the at least two solid state emitters after tuning and filtering; and a detector arrangement configured to detect photon emissions from the at least two solid state emitters after tuning, filtering, and passing through the photon interference arrangement, wherein the detector arrangement is configured to resolve sufficiently small differences in photon detection times that tuned photon emissions from the at least two solid state emitters are quantum mechanically indistinguishable resulting in quantum interference between indistinguishable photon emissions from different solid state photon emitters.

The excitation arrangement advantageously has sufficiently good resolution to enable selective excitation of specific electron spin states such that the electron spin states are resolvable. The excitation arrangement may be configured to individually address the solid state photon emitters at the same or a different frequency to which the solid state photon emitters emit photons. One advantage to using a different excitation frequency is that the excitation photons can be readily filtered from the solid state photon emission. However, using the same frequency for the excitation as the emission frequency has some benefits in terms of better manipulation and selection of spin states. In such a case, the geometry of the outcoupling structure can be modified to achieve filtering of the solid state emission from the excitation source when the frequency of the excitation and emission overlap.

According to certain embodiments, the filtering arrangement comprises a filtering element configured to separate a zero phonon line emission from a phonon side band emission. Such a filtering arrangement may comprise one or more of a dichroic mirror, a diffraction grating, and a filtering cavity. A dichroic mirror is preferred as it is considered to be the most photon efficient. Furthermore, a dichroic mirror can be used to separate the phonon side band emission such that this emission can be used to monitor and control alignment and/or focussing of the device components. In this regard, it should be noted that the intensity of the phonon side band emission is much higher than the zero phonon line emission to be used for multi-photon interference. As such, fluctuations in emission intensity are more readily detected in the phonon side band emission. Such fluctuations may occur if the excitation arrangement moves from being optimally focussed on the solid state photon emitters. Accordingly, a detector may be configured to measure the separated phonon side band emission and an adjustment configuration may be provided for realigning and/or refocusing components of the quantum processing device if a reduction in intensity of the phonon side band emission is detected to thereby increase the intensity of the phonon side band emission and zero phonon line emission. The detector and adjustment configuration can be arranged to provide an automated feedback mechanism including a processor configured to receive data from the aforementioned side band emission detector and control the adjustment configuration to maintain alignment and/or focussing of the components of the quantum processing device. This can be an important functionality in a commercial device to ensure that the device is robust and remains at optimal performance in use. Optionally, a switching device can also be provided to alter emission modes between parallel and orthogonal polarization. Switching to an orthogonal polarization mode can be used as an additional diagnostic calibration of the device.

The filtering arrangement may also comprise a polarizing beam splitter to selectively filter photons of a common polarization. While the central solid state emitter component as previously described is configured such that $E_x$ or $E_y$ transitions can be selectively excited (as described in more detail later in this specification with reference to FIG. 2), due to phonon assisted cross relaxation between excited states photons from both transitions are contained in the emission. As such, any emission having the wrong polarization can be removed using a polarizing beam splitter. The polarizing beam splitter may also be configured to compensate for changes in dipole orientation as a result of the applied electric field of the tuning arrangement.

After suitable tuning of the solid state photon emitters and filtering of the photo emissions, the photon emissions can be overlapped to achieve photon interference using a beam splitter and detected using a suitable detector configuration. The beam splitter may be a fibre beam splitter or any other suitable arrangement. The detector may be configured to resolve differences in photon detection times smaller than: 1/(a natural linewidth of each solid state photon emitter); 1/(20 times a natural linewidth of each solid state photon emitter); 1/(200 times a natural linewidth of each solid state photon emitter);

1/(500 times a natural linewidth of each solid state photon emitter); 1/(1000 times a natural linewidth of each solid state photon emitter); or 1/(2000 times a natural linewidth of each solid state photon emitter). For example, the detector may have a frequency resolution in a range 0.1 to 25 GHz, 0.5 to 20 GHz, 1 to 15 GHz, 1 to 10 GHz, or 1 to 5 GHz.

Utilizing the device configurations described herein it is possible to achieve a high time resolved multi-photon interference contrast. Advantageously, the time resolved multi-photon interference contrast is greater than 50%, 60%, 65%, 70% or 75%.

An example of the invention is described below in relation to a synthetic diamond solid state component comprising solid state photon emitters. However, it is envisaged that the teachings of this specification may in principle be applied to other types of material.

Many photon emissive defects have been studied in diamond material including: silicon containing defects such as silicon-vacancy defects (Si-V), silicon di-vacancy defects (Si-V$_2$), silicon-vacancy-hydrogen defects (Si-V:H), silicon di-vacancy hydrogen defects (S-V$_2$:H); nickel containing defect; chromium containing defects; and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a negative charge state. Of these defects, the nitrogen-vacancy (NV) defect, and particularly the negatively charged nitrogen vacancy defect (NV$^-$) in synthetic diamond material has attracted a lot of interest as a useful quantum spin defect because it has several desirable features including:
(i) Its electron spin states can be coherently manipulated with high fidelity owing to an extremely long coherence time (which may be quantified and compared using the transverse relaxation time $T_2$).
(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state (i.e. they belong to the same spin state or polarization state).
(iii) Its electronic structure comprises emissive and non-emissive (or less emissive) electron spin states which allows the electron spin state of the defect to be read out through photons. This is convenient for reading out information from synthetic diamond material and is a key ingredient towards using the NV defects as qubits for long-distance quantum communications and scalable quantum computation. Such results make the NV defect a competitive candidate for solid-state quantum information processing (QIP).

The nitrogen vacancy center in diamond is thus one of the most promising systems for quantum information processing in the solid state. Apart from being a highly stable single photon emitter it also possesses a long lived electronic spin even at room temperature. High fidelity initialization and readout of this spin are achieved by optical means while coherent manipulation is realized by applying microwave fields. By extending such techniques to proximal nuclear spins, a controllable few-qubit quantum register can be realized.

To scale such a system beyond a few spins requires a method to couple (entangle) different NVs with each other. While dipolar interactions can locally couple NV centers, optical mechanisms based on photon interference offer the potential for more flexible and longer distance interactions. When two photons that are indistinguishable simultaneously impinge on a beamsplitter they interfere with each other and coalesce into the same output port [C. K. Hong, Z. Y. Ou, and L. Mandel, Phys. Rev. Lett. 59, 2044 (1987)]. By letting photons interfere that are entangled with the spin of the emitter this effect can be used to entangle two distant spins. This type of measurement based entanglement has been achieved for two remote single ions [D. L. Moehring et al., Nature 449, 68 (2007)]. While spin-photon entanglement has been realized using NV centers [E. Togan et al., Nature 466, 730 (2010)], two photon quantum interference (TPQI) has so far remained elusive.

One major problem in producing materials suitable for quantum applications is preventing quantum spin defects from decohering, or at least lengthening the time a system takes to decohere (i.e. lengthening the "decoherence time"). A long $T_2$ time is desirable in applications such as quantum computing as it allows more time for the operation of an array of quantum gates and thus allows more complex quantum computations to be performed. A long $T_2$ time is also desirable for increasing sensitivity to changes in the electric and magnetic environment in sensing applications.

WO 2010010344 discloses that single crystal synthetic CVD diamond material which has a high chemical purity, i.e. a low nitrogen content, and wherein a surface of the diamond material has been processed to minimise the presence of crystal defects, can be used to form a solid state system comprising a quantum spin defect. Where such materials are used as a host for quantum spin defects, long $T_2$ times are obtained at room temperature and the frequency of the optical transitions used to read/write to devices are stable.

WO 2010010352 discloses that by carefully controlling the conditions under which single crystal synthetic CVD diamond material is prepared, it is possible to provide synthetic diamond material which combines a very high chemical purity with a very high isotopic purity. By controlling both the chemical purity and the isotopic purity of the materials used in the CVD process, it is possible to obtain synthetic diamond material which is particularly suitable for use as a host for a quantum spin defect. Where such materials are used as a host for quantum spin defects, long $T_2$ times are obtained at room temperature and the frequency of the optical transitions used to read/write to the devices are stable. A layer of synthetic diamond material is disclosed which has a low nitrogen concentration and a low concentration of $^{13}C$. The layer of synthetic diamond material has very low impurity levels and very low associated point defect levels. In addition, the layer of synthetic diamond material has a low dislocation density, low strain, and vacancy and self-interstitial concentrations which are sufficiently close to thermodynamic values associated with the growth temperature that its optical absorption is essentially that of a perfect diamond lattice.

In light of the above, it is evident that WO 2010010344 and WO 2010010352 disclose methods of manufacturing high quality "quantum grade" single crystal synthetic CVD diamond material. The term "quantum grade" is used herein for diamond material which is suitable for use in applications that utilize the material's quantum spin properties. For example, the quantum grade diamond material's high purity makes it possible to isolate single defect centres using optical techniques known to the person skilled in the art. The term "quantum diamond material" is also used to refer to such material.

It is possible to utilize the methodology described in WO 2010010344 and WO 2010010352 to fabricate a solid state component comprising solid state photon emitters for use in the present invention. However, it has been found to be advantageous to provide photon emissive defects which are preferentially oriented relative to a crystallographic orientation of the diamond material. For example, according to one configuration the diamond material is oriented in a {111} crystallographic orientation and the photon emissive defects each have dipoles corresponding to $E_x$ and $E_y$ transitions lying in a surface plane and orthogonal to each other. Such an arrangement is advantageous as it enables an excitation arrangement to be configured to adjust polarization of the excitation to selectively excite $E_x$ or $E_y$ emission.

While such {111} oriented material could be fabricated directed on a {111} oriented substrate using a CVD technique as described in WO 2010010344 and WO 2010010352, one problem with such an approach is that impurity uptake and crystallographic defects are increased when growing material in such a crystallographic orientation. This can lead to a reduction in the uniformity of the material resulting in dissimilar solid state photon emitters, a reduction in the ability to optically address the solid state photon emitters due to scattering and absorption within the material, a decrease in outcoupling of emitted photons due to scattering and absorption within the material, and a reduction in decoherence time of the solid state photon emitters due to coupling interactions with impurities and/or strain introduced into the material via crystallographic defects.

In light of the above, it has been found that one advantageous route towards achieving the desirable {111} oriented synthetic diamond material with very low impurity content and low crystallographic defects and strain is to grow the synthetic diamond material on a {100} oriented substrate and then cleave or cut the grown material along a {111} orientation in order to yield a {111} orientated synthetic diamond plate. This can be achieved by obtaining a rough reference face via cleaving and polishing. The orientation of the reference face can then be measured by an X-ray diffraction measurement. By subsequent polishing and measuring a true {111} reference face can be obtained. Using this face a slab of material can be obtained by laser sawing or other such techniques and this face polished with respect to the reference face. The accuracy of this reference face is preferably less than 10°, 5°, 3°, 2°, 1°, 0.75°, 0.5°, 0.25°, 0.1°, or 0.05° from a {111} crystallographic plane. Using mechanical polishing techniques that are known in the art it is possible to polish the surface to an RMS surface roughness over a 5 μm×5 μm of less than 5 nm, 1 nm, 0.5 nm, or 0.1 nm. Photon emissive defects such as NV defects can be chosen to lie along {111} crystallographic directions and so each defect will have dipoles corresponding to $E_x$ and $E_y$ transitions lying in a surface plane and orthogonal to each other. Such an orientation enables selective excitation of the $E_x$ or $E_y$ transitions.

The aforementioned approach enables the formation of a synthetic single crystal diamond material having a {111} orientation and which has a low concentration of impurities. For example, a diamond material may be fabricated having at least one high purity portion comprising one or more of: a neutral single substitutional nitrogen concentration equal to or less than 20 ppb, 10 ppb, 5 ppb, 1 ppb or 0.5 ppb; an NV$^-$ concentration equal to or less than 0.15 ppb, 0.1 ppb, 0.05 ppb, 0.001 ppb, 0.0001 ppb, or 0.00005 ppb; and a total concentration of $^{13}C$ equal to or less than 0.9%, 0.7%, 0.4% 0.1%, 0.01%, or 0.001%. Furthermore, at least a portion of the diamond material preferably has one or more of: a boron concentration of 100 ppb or less; a silicon concentration of 100 ppb or less; a concentration of paramagnetic defects of 1 ppm or less; a concentration of any single non-hydrogen impurities of 5 ppm or less; a total impurity content excluding hydrogen and its isotopes of 10 ppm or less; and a concentration of hydrogen impurities in the single crystal diamond host material of $10^{18}$ cm$^{-3}$ or less. The high purity material preferably also has a low concentration of dislocations. For example, the high purity single crystal diamond material may contain a dislocation bundle density equal to or less than: $10^6$ dislocations cm$^{-2}$; $10^4$ dislocations cm$^{-2}$; $3\times10^3$ dislocations cm$^{-2}$; $10^3$ dislocations cm$^{-2}$; $10^2$ dislocations cm$^{-2}$; or 10 dislocations cm$^{-2}$. As such, low impurity, low strain material can be fabricated having a birefringence in a direction perpendicular to a major plane equal to or less than $5\times10^{-5}$, $1\times10^{-5}$, $5\times10^{-6}$, or $1\times10^{-6}$. In addition, solid state photon emitters disposed in such material can have a decoherence time $T_2$ equal to or greater than 0.05 ms, 0.1 ms, 0.3 ms, 0.6 ms, 1 ms, 5 ms, or 15 ms, with corresponding $T_2$* values equal to or less than 400 μs, 200 μs, 150 μs, 100 μs, 75 μs, 50 μs, 20 μs, or 1 μs.

After fabrication of the above described material, the material must be carefully processed to form a suitable low roughness, high flatness surface for subsequent fabrication of optical outcoupling structures. In this regard, it is to be noted that {111} orientated diamond material is difficult to process when compared to other crystallographic orientations as the {111} crystallographic plane of diamond material has the highest wear resistance when compared to other crystallographic orientations. As such, care must be taken to process this surface to a suitable surface finish without introducing defects into the material which would otherwise compromise performance.

After fabrication and processing to yield a suitable {111} oriented surface, a plurality of optical outcoupling structures such as solid state immersion lenses can be fabricated on the surface of the synthetic diamond component. In this regard, both WO 2010010344 and WO 2010010352 disclose that the quantum grade diamond material discussed therein may have a surface which has a macroscopic curvature, e.g. a lens with a radius of curvature of between about 10 μm and about 100 μm to collect and focus the light output from a quantum defect centre. However, as previously described, in accordance with embodiments of the present invention it is important to ensure the optical outcoupling structures are associated with suitably similar photon emissive defects. As such, prior to forming optical outcoupling structures, at least two solid state photon emitters may be identified having a low photon emission peak bandwidth and a low frequency difference between peak intensities. This may be achieved using a laser to resonantly excite solid state photon emitters and detecting red shift fluorescence into a phonon side band. Alternatively, off-resonance excitation and a scanning Fabry Perot interferometer may be utilized. The outcoupling structures may then be fabricated over, and centred on, the identified solid state photon emitters to ensure optimal outcoupling from these photon emitters. Ion beam milling may be used to form the optical outcoupling structures. To increase the number of photons detected it is preferable if the diamond slab from which the outcoupling structures are fabricated are of comparable size to the fabricated outcoupling structure. This is so that any photons emitted away from the outcoupling structure are collection upon reflection from the back surface. Reducing the thickness of the diamond slab reduces the possible number of angles for a photon to escape collection. For example, in certain embodiments the diamond material may form a layer or plate with a thickness less than 1 mm, 0.5 mm, 100 μm, 50 μm, or lower. For example, the diamond material may form a layer or plate with a thickness in a range 100 nm to 50 μm, 500 nm to 30 μm, 1 μm to 20 μm, or 5 μm to 10 μm. However, for certain other applications it may be desirable to form a thicker layer or plate of material. For example, using the fabrication techniques described herein it is possible to provide high purity, low strain material having a thickness greater than 1 mm, 1.5 mm, 2 mm, or 3 mm. Additionally, to increase the number of collected photons the outcoupling structure can be coated with an anti reflection coating. Also, by coating the back of the layer or plate with a mirror, such as a metallic coating or a semiconductor Bragg stack, photon collection can be further increased.

Certain embodiments of the present invention utilized naturally occurring (i.e. as-grown rather than implanted) NV centers in type IIa chemical vapor deposition grown diamond with a <111> crystal orientation. Because two photon quantum interference measurements involve coincident detection of photons emitted from two centers, high collection efficiency is important. This has been achieved by deterministically fabricating solid immersion lenses (SILs) (i.e., outcoupling structures) [J. P. Hadden et al., Appl. Phys. Lett. 97, 241901 (2010) and P. Siyushev et al., Appl. Phys. Lett. 97, 241902 (2010)] around preselected centers by focused ion beam milling. FIG. 1(a) shows an optical microscope image of the sample being used; the inset is an SEM picture of a similar device. In the confocal scans (FIG. 1(b)) the NV centers (i.e., solid state photon emitters appear as bright spots inside the lenses. A gold microwave stripline (MW) and gates (G1 and G2) (i.e., a tuning arrangement) have been fabricated around the solid immersion lenses (i.e., outcoupling structures) using electron beam lithography, enabling spin manipulation and Stark tuning of the NV transition energies respectively. Two NV centers within the same diamond are individually addressed using a dual path confocal setup.

FIG. 1(c) schematically illustrates a device configuration for achieving multi-photon interference. Two NV centers (i.e., solid state photon emitters) inside the same synthetic diamond element are simultaneously excited with either a resonant (637 nm) or an off-resonant (532 nm) laser (i.e., an excitation arrangement). Two separate paths allow detection of photons emitted into the zero phonon line (ZPL) or the phonon side band (PSB). A variable retardance wave plate (WP) is used to compensate for ellipticities introduced by optical components to the polarization of the emitted photons and to align the polarization of the desired transition to the polarizing beam splitter (PBS) (i.e., a photon interference arrangement).

Figure 2:
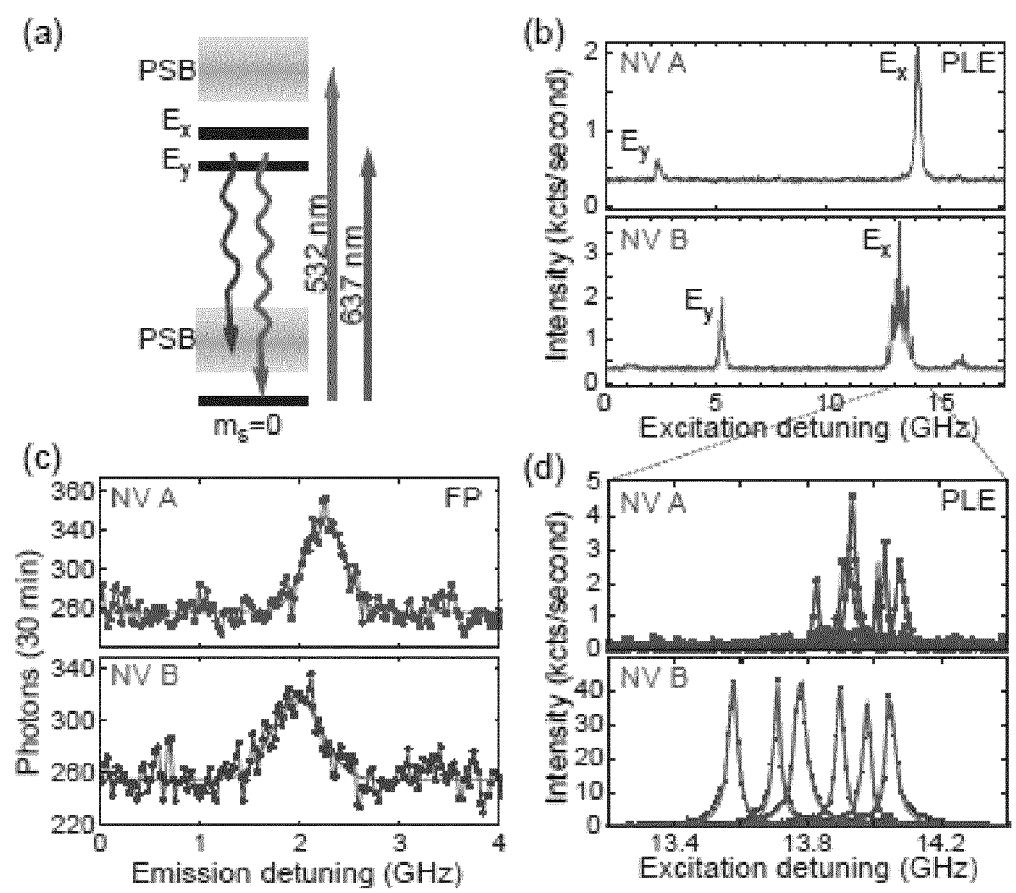
FIGS. 2(a) to 2(d) illustrate various spectral characterizations of the two NV defects (NV A and NV B)

FIGS. 2(a) to 2 (d) illustrate various spectral characterizations of the two NV defects (NV A and NV B). FIG. 2(a) shows the electronic energy level structure of an NV defect. The ms=0 ground state is connected via spin selective transitions to the $E_x$ and $E_y$ excited state. Photons that are emitted into the phonon side band (PSB) can be spectrally separated from resonant emission. Also shown are the resonant (637 nm) and the off-resonant laser (532 nm). FIG. 2(b) shows resonant excitation and detection of the PSB. The frequency of the red laser is swept across the resonances while weak green laser prevents photoionization and optical pumping. The spectra are an average of 70 scans. FIG. 2(c) shows scanning Fabry-Perot spectra under off-resonant excitation. Only the $E_x$ transition is visible confirming sufficient suppression of the Ey transition by polarization filtering. The linewidths (450 MHz for NV A and 570 MHz for NV B) include drifts of the cavity during the measurement. The offset is due to detector dark counts. FIG. 2(d) shows single resonant excitation scans. The average individual line width is 38(±7) MHz for NV A and 36(±5) MHz for NV B. The overall distribution of frequencies is larger due to spectral diffusion (263 MHz for NV A and 483 MHz for NV B).

The optical transitions of the NV center (FIG. 2(a)) consist of both direct transitions between the ground and the excited state (the so-called zero phonon line, ZPL) and transitions that additionally involve the emission or absorption of phonons (phonon side band, PSB). At low temperatures, the zero phonon line emission exhibits several narrow lines which, for low strain centers, correspond to spin selective transitions between the ground and excited state [J. R. Maze et al., New J. Phys. 13, 025025 (2011)]. Observation of two photon quantum interference requires isolating a single transition within the zero phonon line. After removing the incoherent fraction of the emission (the phonon side band, PSB) by spectral filtering, a single emission line within the zero phonon line ZPL is selected by exploiting the spin and optical polarization properties of the NV center. Specifically, an off-resonant excitation is employed to pump the spin into the $m_s$=0 state. The emission is therefore dominated by transitions from the $m_s$=0 $E_x$ and $E_y$ excited states to the $m_s$=0 level in the ground state. The two dipoles associated with these transitions are orthogonal to each other and to the NV axis; by working with NV centers oriented along the <111> direction it is ensured that the two transitions emit zero phonon line photons with orthogonal linear polarizations [K. -M. C. Fu et al., Phys. Rev. Lett. 103, 256404 (2009) and F. Kaiser et al., arXiv:0906.3426]. Consequently, it is possible to isolate the $E_x$ or $E_y$ emission line by placing a polarizer in the detection path. Furthermore, the signal is maximized by using the polarization selectivity to excite only one dipole.

To characterize the zero phonon line fine structure, photoluminescence excitation (PLE) is used to probe the zero phonon line absorption spectrum and a scanning Fabry-Perot (FP) cavity is used to analyze the ZPL emission spectrum. Photoluminescence excitation spectra are obtained by sweeping the frequency of the resonant excitation laser (637 nm, FIG. 1(c)) across the NV zero phonon line transitions while recording the red-shifted emission into the phonon side band. During photoluminescence excitation scans, visibility of the $m_s$=0 transitions is ensured by either applying weak green excitation to continuously initialize the spin into $m_s$=0 (used for FIG. 2(b)) or by applying microwaves to maintain an equal distribution of the spin states (used for FIG. 2(d)); in the latter case a green repump pulse between the scans prevents permanent photoionization into the $NV^0$ charge configuration [G. Waldherr et al., Phys. Rev. Lett. 106, 157601 (2011) and L. Robledo, H. Bernien, I. van Weperen, and R. Hanson, Phys. Rev. Lett. 105, 177403 (2011)]. FIG. 2(b) shows the PLE spectra of the two selected emitters. While the lower-energy $E_y$ transitions are 2.9 GHz apart from each other, the higher-energy $E_x$ transitions partly overlap. This near-overlap is also observed by using a scanning Fabry-Perot cavity to monitor the zero phonon line emission under off-resonant (532 nm) excitation (FIG. 2(c)). By filtering out the linearly polarized light associated with the $E_x$ transitions alone, a single emission line is observed from each NV center with nearly equal frequencies.

The emission linewidths of both sources will limit the observability of quantum interference. Individual photoluminescent excitation spectra, recorded in the absence of green light, show narrow 38 MHz (36 MHz) linewidths for NV A and NV B (FIG. 2(c)); however, a 532 nm repump pulse between scans leads to an overall distribution of frequencies with an inhomogeneous linewidth of a few hundred MHz [L. Robledo, H. Berrien, I. van Weperen, and R. Hanson, Phys. Rev. Lett. 105, 177403 (2011)]. Spectral diffusion is also observed in photoluminescence excitation spectra recorded with simultaneous green excitation (FIG. 2(b)) and in the zero phonon line emission spectrum under 532 nm excitation (FIG. 2(c)). Although the observed inhomogeneous broadening exceeds the radiative linewidth by an order of magnitude, two photon interference effects can still be detected. Provided that the emission linewidth does not exceed the inverse time resolution of the photon detectors, simultaneous detection of a photon from each NV center erases the which-path frequency information, allowing quantum interference to be observed [T. Legero et al., Phys. Rev. Lett. 93, 070503 (2004) and R. Lettow et al., Phys. Rev. Lett. 104, 123605 (2010)].

For the interference measurement, a green (532 nm) pulsed laser is employed with a repetition frequency of 10 MHz both to excite the two NV centers and to initialize the spin state into ms=0. A combination of spectral filtering (ZPL filter) and polarization rejection (as discussed above) isolates the Ex lines of NV A and B. This emission is then coupled into the two input ports of a polarization-maintaining fiber beamsplitter, ensuring excellent spatial mode overlap. Temporal mode overlap is achieved by using equidistant excitation and collection paths for the two centers. The output ports of the beam splitter are connected to two avalanche photo diodes (APDs, shown in FIG. 1(c)) (i.e., a detector arrangement) with subnanosecond time resolution; the APD signals trigger the start and the stop of a fast counting module whose jitter is less than 4 picoseconds. By recording the coincidence counts as a function of start-stop delay, a time-resolved measurement is performed.

Figure 3:
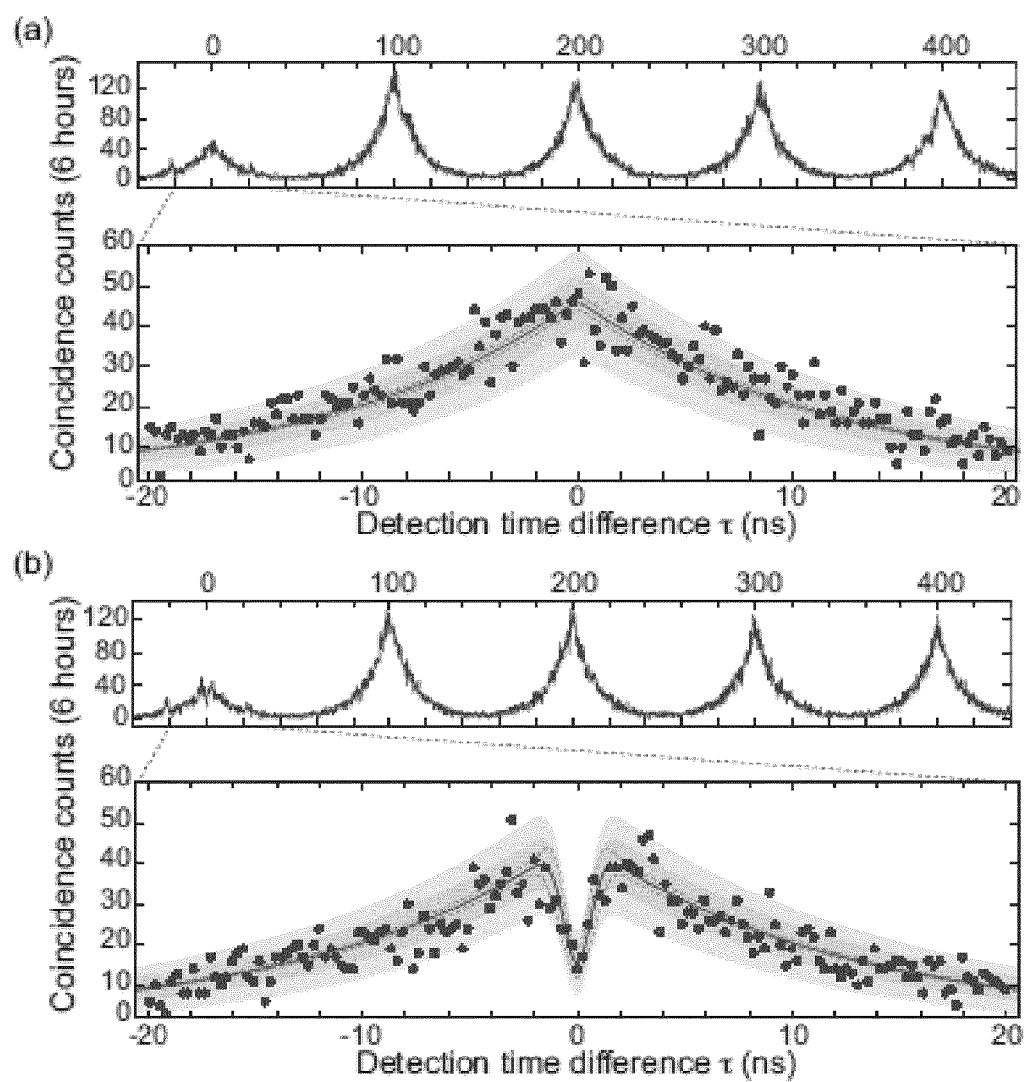
FIGS. 3(a) and 3(b) illustrate results indicating two photon quantum interference for orthogonal and parallel polarization respectively.

FIGS. 3(a) and 3(b) illustrate results indicating data for orthogonal and parallel polarization respectively. FIG. 3(a) illustrates the case for orthogonal polarization. Periodic peaks of the coincidence counts correspond to the 10 MHz repetition frequency of the excitation. The coincidence distribution shows typical bunching and anti-bunching features of the two independent NV centers under pulsed excitation. FIG. 3(b) illustrates the case for parallel polarization. Indistinguishable photons that overlap on the beamsplitter interfere with each other and lead to a significant decrease in coincidence events at zero time delay. Simulations (solid line) using only independently measured parameters are done according to Legero et al. [T. Legero, T. Wilk, A. Kuhn, and G. Rempe, Appl. Phys. B 77, 797 (2003)]. The dashed lines show 1 standard error uncertainty in the simulation. The dark and light shaded areas illustrate 1 and 2 standard deviations expected scatter. Parameters used for the simulations are: excited state lifetime=12.0(±0.4) ns, detuning between the two centers=130(±150) MHz, frequency jitter between them=550(±80) MHz, APD jitter=410(±10) ps, dark count rate=60(±10) $s^{-1}$, NV B count rate=1470(±50) $s^{-1}$, NV A count rate=2700(±50) $s^{-1}$, background=15(±5) %.

As a calibration experiment, a $\lambda/2$ wave plate is inserted into one detection path so that the two photons entering the beamsplitter have orthogonal polarization. This makes the two photons distinguishable and no interference can be observed. Therefore the coincidence distribution only reveals the temporal overlap of two independent photon wave packets (see FIG. 3(a)). The situation changes dramatically when the photons enter the beam-splitter with parallel polarization (FIG. 3(b)). For this case two photon quantum interference is observed: at zero detection time difference ($\tau$=0) the two photons mainly leave the beamsplitter into the same output port, leading to a significant reduction in coincidence detections. For larger time differences interference is concealed because of averaging over many photons with different frequencies [T. Legero, T. Wilk, A. Kuhn, and G. Rempe, Appl. Phys. B 77, 797 (2003)]. Two photon quantum interference is thus observed as a reduction in coincidence detection events within a time window given by the inverse of the inhomogeneous emission linewidth.

Ideally, zero time difference coincidence detection cannot occur even for inhomogeneously broadened and detuned photon sources [T. Legero et al., Phys. Rev. Lett. 93, 070503 (2004)]. The reduced contrast arises primarily from NV emission into undesired spectral lines owing to imperfect control over the charge and spin state of the center. Specifically, when the center is in the neutral charge state)($NV^0$), a portion of its broadband fluorescence lies within the 3 nm bandwidth of the zero phonon line filters; from independently measured optical spectra, these $NV^0$ photons contribute approximately 10% to the collected emission. Furthermore, under 532 nm excitation a residual ~10% $m_s$=±1 spin occupation produces circularly polarized emission on several other transitions, contributing ~5% of our polarization filtered signal. From such a 15% background level up to 72% visibility it expected. Moreover, finite time resolution in the detection system will average over sharp temporal features, raising the depth of the zero-time-difference minimum.

A quantitative agreement between experimental data and no-free-parameter simulations has been observed. Following Legero et al. [T. Legero, T. Wilk, A. Kuhn, and G. Rempe, Appl. Phys. B 77, 797 (2003)], two photon quantum interference of exponentially decaying photon wavepackets with Gaussian frequency noise has been modelled and expected coincidence detections calculated using independently measured parameters. At $\tau$=0 a contrast of 66(±10) % is observed which is, to the inventor's knowledge, the highest value reported for two separate solid state emitters [R. Lettow et al., Phys. Rev. Lett. 104, 123605 (2010), K. Sanaka et al., Phys. Rev. Lett. 103, 053601 (2009), R. B. Patel et al., Nat. Photon. 4, 632 (2010), and E. Flagg et al., Phys. Rev. Lett. 104, 137401 (2010)]. This value can be improved by more stringent filtering of the zero phonon line emission or by increased control over the spin and charge states.

To observe two photon quantum interference NV centers were selected with nearly identical $E_x$ frequencies; in general, however, because of their different strain environments, two NV centers are unlikely to exhibit the same emission frequencies [N. B. Manson, J. P. Harrison, and M. J. Sellars, Phys. Rev. B 74, 104303 (2006)]. Even in high purity type IIa diamond samples, typically a spread of tens of GHz between different centers is observed. Nevertheless, NVs can be tuned into resonance by applying electrical fields to induce DC Stark shifts in the transition energies [P. Tamarat et al., Phys. Rev. Lett. 97, 083002 (2006)]. The tuning range of the present devices reaches several GHz and is enhanced to tens of GHz in the presence of 532 nm excitation [L. C. Bassett et al., Phys. Rev. Lett. 107, 266403 (2011)]. This enables observation of two photon quantum interference in the general case of dissimilar sources.

Figure 4:
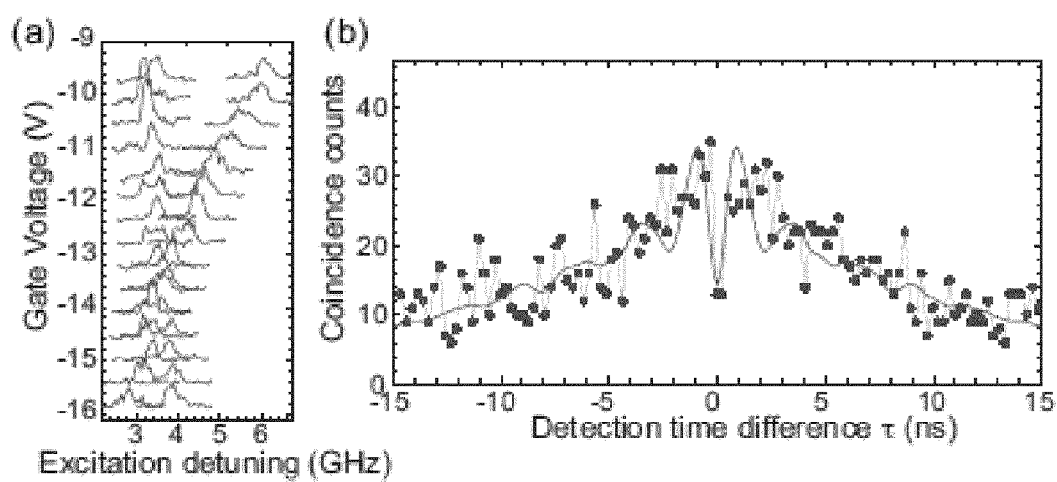
FIGS. 4(a) and 4(b) illustrate results indicating tuning and two photon quantum interference of two dissimilar solid state photon sources.

FIGS. 4(a) and 4(b) illustrate results indicating tuning and two photon quantum interference of two dissimilar solid state photon sources. FIG. 4(a) shows $E_y$ transition energies in dependence of applied gate voltage. The two centers show opposite tuning behavior and are brought into resonance at −13.6V. Data is taken under simultaneous green excitation with the same power that is used for the interference measurement. FIG. 4(b) shows two photon quantum interference. The overall coincidence distribution is the sum of 255 one-minute histograms. Before each interference measurement a photoluminescent excitation scan is performed. Only histograms for which the relative detuning of the two centers is between 350 and 1200 MHz were selected. Simulations (solid line) are based on the measured frequency distribution.

In the absence of an external voltage bias, the $E_y$ transitions of NV A and NV B lie far apart in energy so that their two photon quantum interference cannot be measured within the time resolution of detectors. By applying a voltage to gate 1 (FIG. 1(a)) while keeping the microwave stripline and gate 2 on ground, it is possible to tune the $E_y$ transitions into resonance. Because the degree of tuning is strongly affected by the presence of off-resonant excitation [L. C. Bassett et al., arXiv:1104.3878], the Stark tuning is calibrated under the same pulsed 532 nm excitation conditions as used for the interference measurement: the photoluminescent excitation spectra in FIG. 4(a) show the additional fluorescence induced by resonant excitation, revealing the spectral location of the $E_y$ line. Near −13.6 V, overlapping transition energies are observed for the two NV centers, establishing the appropriate setting for observation of two photon quantum interference. However, in addition to shifting the energy of the NV center transitions, applied electric fields can also rotate the axes of the $E_x$ and $E_y$ dipoles; it has been found that significantly different polarization settings are required to filter the $E_y$ emission at this gate voltage.

Using the calibrated voltage and polarization settings, the time-resolved interference of photons emitted on the Ey transitions from each NV center has been measured. FIG. 4(b) shows a significant decrease in coincidence detection events at zero time difference. The width of the interference signal is smaller than which would be expected from earlier measurements of the inhomogeneous linewidth of the emitters. Because the laser intensity changes the effective Stark shift, a drift in sample position directly translates into a spectral shift. To account for the spectral variations, the measurement is performed by alternating photoluminescent excitation spectroscopy and minute-duration coincidence detection, and post-selecting the data based on their relative detuning. Simulations performed using the measured frequency distribution exhibit reasonable agreement with the data, but cannot fully account for drifts that occur during the coincidence detection interval. Increased control over spatial and laser power fluctuations should thereby greatly enhance the interference contrast in the presence of gate voltage tuning.

Two photon quantum interference has become one of the key measurements in quantum optics and is an essential requirement for measurement based entanglement [D. L. Moehring et al., Nature 449, 68 (2007)], quantum repeaters [L. Childress, J. M. Taylor, A. S. Sorensen, and M. D. Lukin, Phys. Rev. Lett. 96, 070504 (2006)] and optical quantum computation [E. Knill, R. Laflamme, and G. J. Milburn, Nature 409, 46 (2001)]. Here this effect has been demonstrated for the first time using two separate NV centers in diamond material by utilizing recent advances in the understanding of the excited state structure together with the previously described materials engineering and micro-fabrication techniques. Using off-resonant pulsed excitation combined with polarization and frequency filtering, a visibility of 66% has been obtained for time-resolved coincidence detection. In addition, it has been shown that two photon quantum interference can also be observed between NVs with dissimilar transition frequencies by using electric fields to tune the NV centers into resonance thereby demonstrate scalability of this approach to commercial devices. Furthermore, when combined with recently-demonstrated spin-photon entanglement [E. Togan et al., Nature (London) 466, 730 (2010)] these results enable remote entanglement of NV centers and open the door to applications in quantum information processing and long distance quantum communication.

An example of how the device configuration as described herein can be used in quantum information processing applications is given below for illustrative purposes. This example relates to entanglement of solid-state qubits by projective measurement.

Measurements play a unique role in quantum mechanics. A quantum measurement projects a system into an eigenstate of the measurement operator and therefore provides a powerful way to manipulate and control quantum states. Here a two-qubit parity measurement on nuclear spins in diamond material is experimentally demonstrated and used to generate maximally entangled Bell states. The resulting high degree of entanglement is confirmed by quantum state tomography. By combining the measurement-based entanglement with single-shot two-qubit readout, a violation of Bell's inequality is observed without assuming fair sampling. The non-destructive measurements demonstrated here are a key element of quantum error correction and pave the way towards measurement-based quantum computing with solid-state qubits.

The effect of a measurement on a physical system reveals one of the most striking differences between classical and quantum behavior. Whereas a classical measurement only yields information on the state of the system, a quantum measurement modifies the state: the system is projected into an eigenstate of the measurement operator. This alteration can be used to manipulate and control quantum systems. In the context of quantum information processing, quantum measurements have been recognized as a powerful tool that can replace unitary multi-qubit gates as the principal constituent of a universal quantum computer, for example in one-way [R. Raussendorf, and H. J. Briegel, Phys. Rev. Lett. 86, 5188 (2001)] and teleportation-based [D. Gottesman, and I. L. Chuang, Nature 402, 390 (1999); E. Knill, R. Laflamme, and G. J. Milburn, Nature 409, 46 (2001)] quantum computing. Moreover, measurements can create entanglement—the main resource for quantum computing—without requiring a direct interaction between the qubits (FIG. 5A) [L. M. Duan et al., Nature 414, 413 (2001); C. W. Chou et al., Nature 438, 828 (2005); D. N. Matsukevich et al., Phys. Rev. Lett. 100, 150404 (2008); M. Riebe et al., Nat Phys 4, 839 (2008); S. Olmschenk et al., Science 323, 486 (2009)].

Of particular interest are parity measurements: joint measurements on a multi-qubit state that determine whether an even or odd number of qubits are in a particular eigenstate, without revealing any information about the states of the individual qubits. For two qubits a parity meter thus determines whether the qubits have the same value (i.e. they occupy the even subspace $\{|00\rangle, |11\rangle\}$) or opposite values (i.e. they are in the odd subspace $\{|101\rangle, |10\rangle\}$). Such measurements play a key role in quantum error correction [M. A. Nielsen, and I. L. Chuang (Cambridge Univ. Press, 2000)], enable deterministic universal two-qubit gates [C. W. J. Beenakker et al., Phys. Rev. Lett. 93, 020501 (2004); H. A. Engel, and D. Loss, Science 309, 586 (2005); B. Trauzettel et al., Phys. Rev. B 73, 235331 (2006)], and can deterministically generate maximally entangled states [W. Mao et al., Phys. Rev. Lett. 93, 056803 (2004); B. Trauzettel et al., Phys. Rev. B 73, 235331 (2006); K. Lalumiere et al. Phys. Rev. A 81, 040301 (2010)]. Numerous implementations of projective parity measurements have been proposed for solid-state qubits [C. W. J. Beenakker et al., Phys. Rev. Lett. 93, 020501 (2004); H. A. Engel, and D. Loss, Science 309, 586 (2005); B. Trauzettel et al., Phys. Rev. B 73, 235331 (2006); R. Ionicioiu, Phys. Rev. A 75, 032339 (2007); K. Lalumiere et al. Phys. Rev. A 81, 040301 (2010)], but experimental demonstrations have remained elusive.

Here a non-destructive parity measurement is demonstrated and used to project two spin qubits into a highly entangled state. The two qubits can be directly projected into any of the Bell states by adapting the pre-measurement state and conditioning on different measurement outcomes. A high degree of entanglement by quantum state tomography is demonstrated and violations of Bell's inequality are observed without assuming fair sampling.

Figure 5:
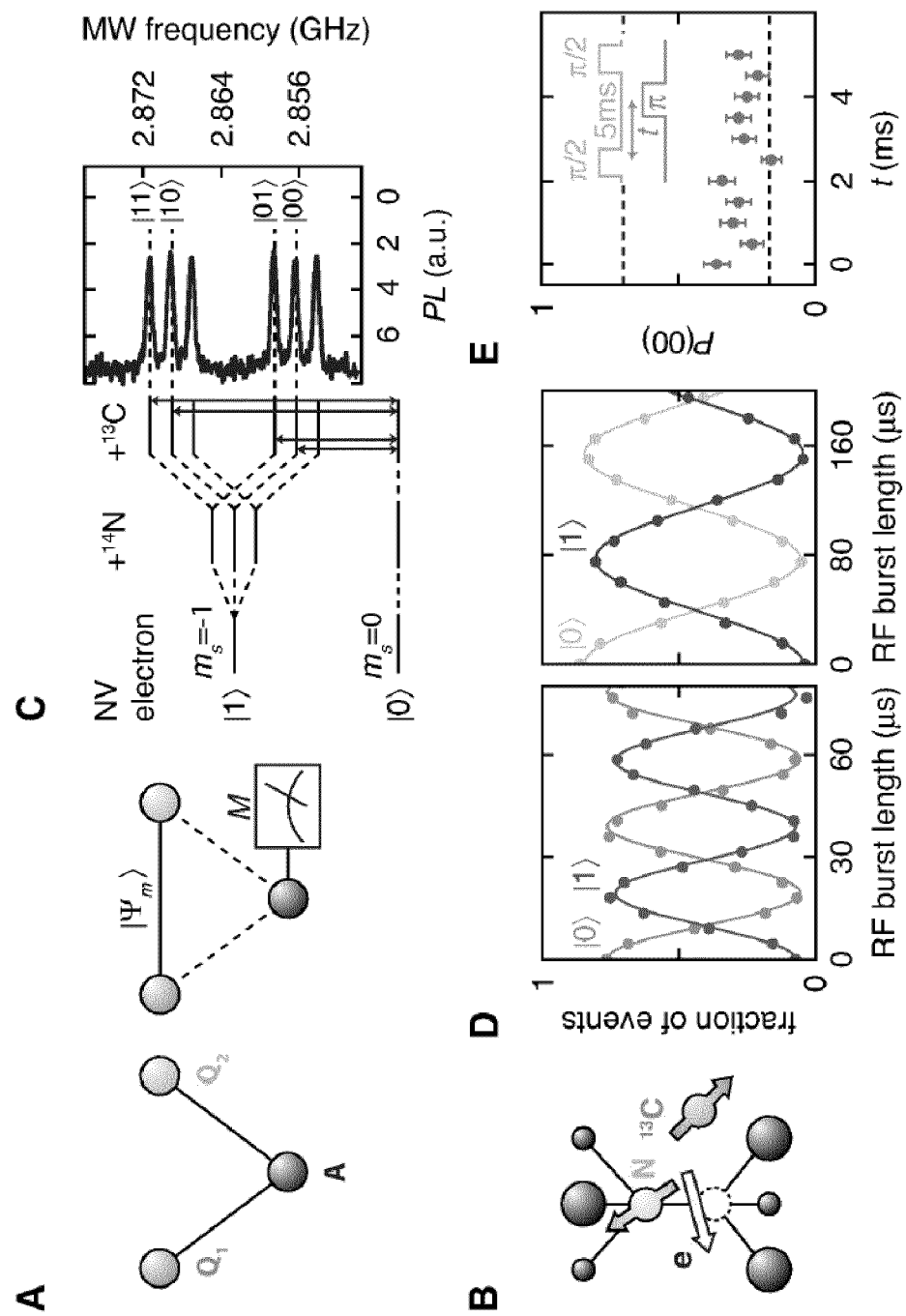
FIG. 5(a) illustrates entanglement by measurement with: the left-side figure showing two qubits, Q1 and Q2, which do not interact with each other, but are individually entangled with an ancillary quantum system A; and the right-side figure showing that reading out A can project Q1 and Q2 into an entangled state $|\Psi_m\rangle$.
FIG. 5(b) illustrates the NV center in diamond material: the spins of the 14N nucleus of the NV center and a close-by 13C nucleus serve as qubits Q1 and Q2; the NV electron spin is used as the ancilla A.
FIG. 5(c) illustrates energy levels and spectrum for the $m_s=0-m_s=-1$ electron spin transition, measured with off-resonant optical excitation: a small magnetic field (approximately 5G) is applied to lift the degeneracy between $m_s=\pm 1$ and the transition is split into six well resolved resonances due to the hyperfine interactions with the 14N (coupling constant 2.184 MHz) and the 13C nuclei (12.796 MHz) allowing conditional operations on the electron (arrows)
FIG. 5(d) illustrates single-shot Rabi oscillations of the 13C (left) and 14N (right) spin qubits.
FIG. 5(e) illustrates measurement of the direct dipolar coupling between the nuclear spins including measurement of the free induction of the nitrogen spin and flip of the carbon spin during an interpulse delay; the absence of oscillations in the signal (the dashed lines mark the expected amplitude) confirm that the nuclei do not interact directly on these time scales (error bars are 1 standard deviation)

Two nuclear spins are used in diamond material as qubits: the nitrogen-14 nuclear spin (14N, I=1) associated with a nitrogen-vacancy (NV) center and a nearby carbon-13 nuclear spin (13C, I=½) (FIG. 5B). The NV electron spin (S=1) serves as an ancillary qubit for the parity measurement. The NV center combines long spin coherence times [G. Balasubramanian et al., Nat Mater 8, 383 (2009); G. de Lange et al., Science 330, 60 (2010)] and a robust optical interface [E. Togan et al., Nature 466, 730 (2010); B. B. Buckley et al., Science 330, 1212 (2010)]. Together with nuclear spins in the environment it forms a few-qubit quantum register [M. V. G. Dutt et al., Science 316, 1312 (2007); Neumann 2007, L. Robledo et al., Nature 477, 574 (2011)], making it a promising solid state platform for quantum information processing.

Spin-resolved resonant optical excitation enables efficient initialization (fidelity>99.9%, supplementary information) and projective single-shot readout (average fidelity approximately 93%) of the ancilla electron spin [L. Robledo et al., Nature 477, 574 (2011)]. The electron spin couples to both the nuclear qubits through a hyperfine interaction (FIG. 5C), so that nuclear spins can be both initialized [Neumann 2010, L. Robledo et al., Nature 477, 574 (2011)] and measured [M. V. G. Dutt et al., Science 316, 1312 (2007); P. Neumann et al., Science 320, 1326 (2008); P. Neumann et al., Science 329, 542 (2010); L. Robledo et al., Nature 477, 574 (2011)] by mapping their state onto the electron spin.

The two nuclear spin qubits can be individually controlled with high precision in tens of microseconds by radio-frequency pulses (FIG. 5D), while a free evolution decay time T2* that exceeds a millisecond is measured for both qubits. A double resonance experiment indicates that the direct interaction between the qubits is negligible (<100 Hz) on the time scales of the experiments (<1 ms) (FIG. 5E), consistent with the distance between the spins [B. Smeltzer et al., New J. Phys. 13, 025021 (2011)].

Figure 6:
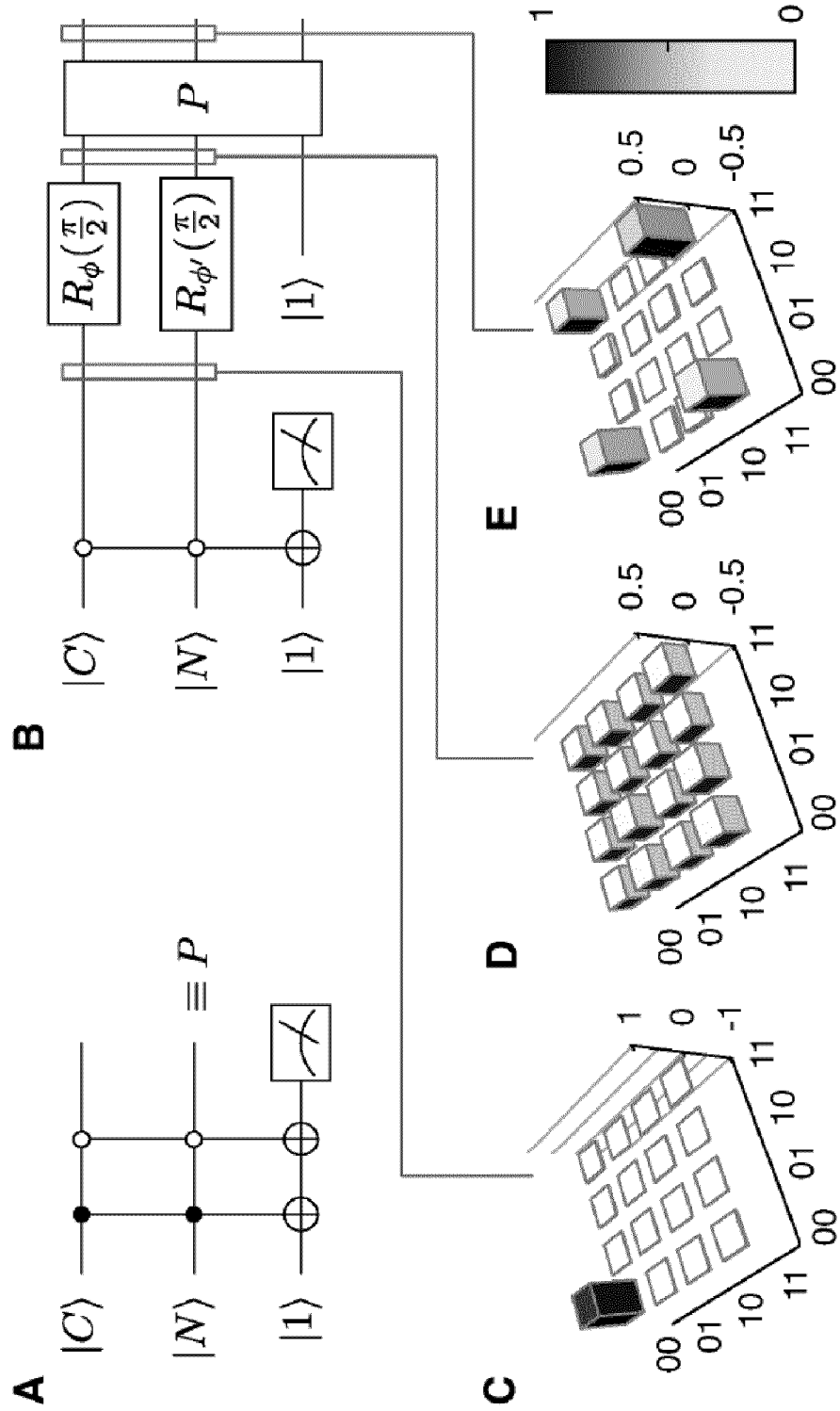
FIG. 6(a) illustrates a circuit diagram for the implementation of the parity measurement conditioned on outcome '0' for the ancilla electron readout (for outcome '1', the measurement is aborted)
FIG. 6(b) illustrates a circuit diagram of the scheme to create entanglement by measurement including first initializing the qubits into |00⟩ by measurement—after creating a maximal superposition, the parity measurement projects the qubits into a Bell state.
FIG. 6(c) illustrates the real part of the measured density matrix elements after initialization, FIG. 6(d) for the maximal superposition state, and FIG. 6(e) for the Bell state |Φ⁺⟩—the imaginary parts of all elements are smaller than 0.07—the measured density matrix yields a state fidelity of 90+/−3%.

The implementation of the parity measurement is depicted in the circuit diagram of FIG. 6A. First, the ancilla is initialized into $|1\rangle$. Then, two NOT gates are applied to the ancilla controlled by the two qubits (Toffoli gates) through selective microwave pi-pulses (FIG. 5C). The ancilla changes state if the qubits are in an even state, i.e. if both qubits have value "0" (first gate) or if both have value "1" (second gate). This operation entangles the ancilla with the qubits so that the odd and even subspaces are mapped on its state. Finally the ancillary qubit is read out to determine the parity of the two-qubit state.

The key experimental challenge posed by a non-destructive parity measurement is the requirement that the phase of superpositions, e.g. the Bell states, needs to be preserved. This is a much more demanding requirement than a non-destructive single-qubit measurement that erases any quantum information [L. Robledo et al., Nature 477, 574 (2011); P. Neumann et al., Science 329, 542 (2010); G. Waldherr et al., Phys. Rev. Lett. 106, 157601 (2011)]. For the system described herein, uncontrolled flips of the ancillary electron spin cause dephasing of the nuclear qubits [L. Jiang et al., Phys. Rev. Lett. 100, 073001 (2008)]. These electron spin flips can occur during the optical readout due to spin mixing in the optically excited state [L. Robledo et al., Nature 477, 574 (2011)]. To avoid dephasing, a short non-destructive read-out of the ancilla conditioned on outcome $|0\rangle$ is used to obtain a non-destructive parity measurement with a high fidelity, at the cost of a lower success rate. The projection results in an electron state fidelity of 99+/−1% after the measurement with a success probability of approximately 3%.

The parity measurement is applied to project the two nuclear qubits into a Bell state. FIG. 6B shows the circuit diagram of the protocol. Quantum state tomography is performed at three stages. First, the nuclear spins are initialized by projective measurement into $|00\rangle$ (FIG. 6C) [L. Robledo et al., Nature 477, 574 (2011)], and the ancilla is reset to $|1\rangle$. Second, a maximal superposition is created by applying pi/2-pulses separately on both nuclear spins, so that the two qubit state is the product state $(|00\rangle+|01\rangle+|10\rangle+|11\rangle)/2$ (FIG. 6D). Finally the parity measurement projects the nuclear spins into the even subspace, and thus into the Bell state $|\Phi^+\rangle$. A fidelity with the ideal state of F= $qj\langle\Phi^+|\rho_m|\Phi^+\rangle$ =90+/−3% is measured, where $\rho_m$ is the measured density matrix (FIG. 6E). The deviation from a perfect Bell state is fully accounted for by errors in the microwave pulses that reset the ancilla to $|1\rangle$ after both projection steps. The high fidelity obtained confirms the non-destructive nature of the parity measurement.

Figure 7:
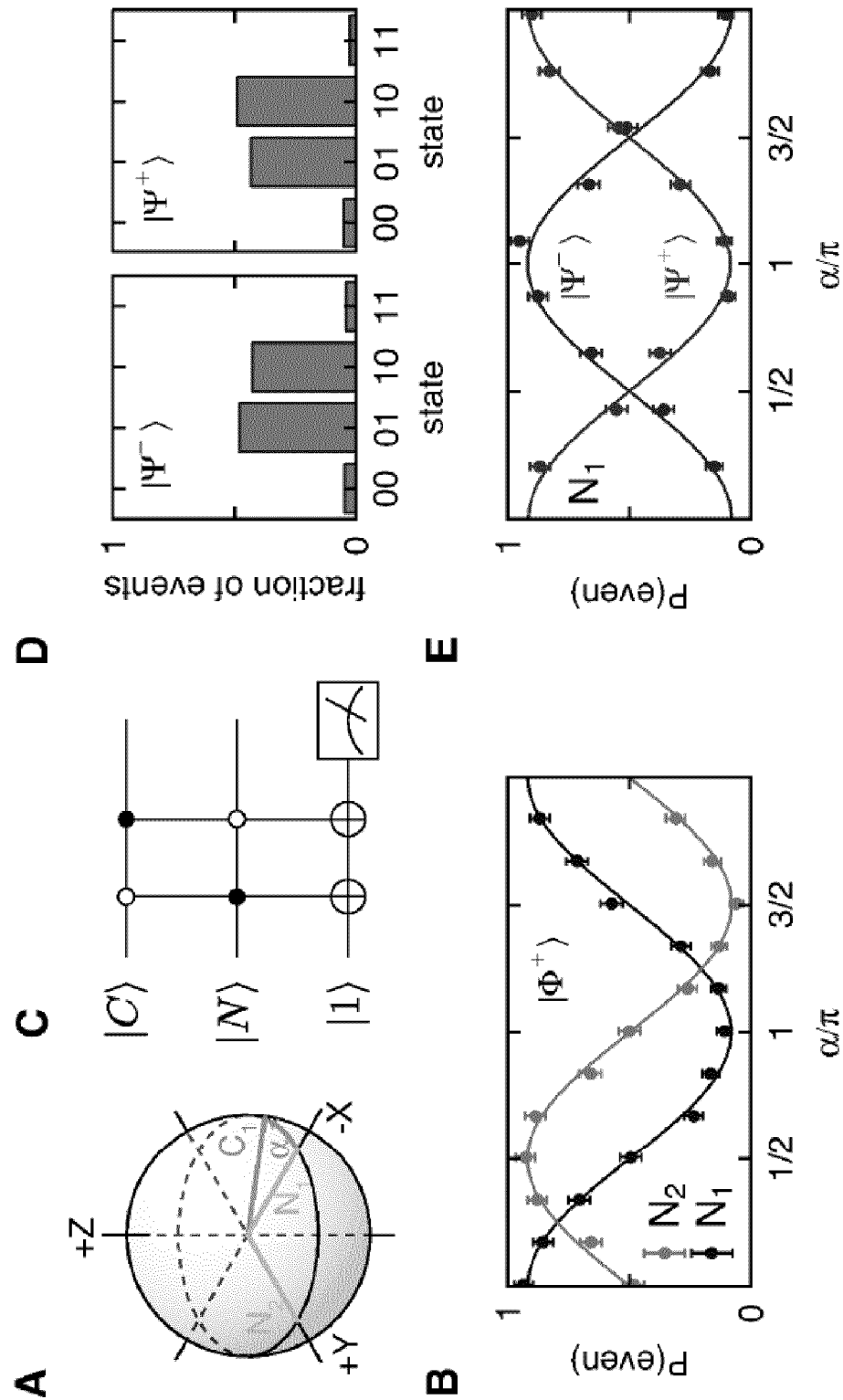
FIG. 7 (c) illustrates projection into the odd correlation subspace by adapting the Toffoli gates in the parity measurement.

A state is created and its transformation behavior studied by directly measuring the quantum correlations of the two qubits in sets of different bases (FIGS. 7A and B). These results verify our ability to operate on the generated entangled state with high fidelity and corroborate the observation that the coherence is conserved to a high degree during the measurement.

The qubits can be projected into any of the Bell states. We create the states $|\Psi^+\rangle$ and $|\Psi^-\rangle$ by projecting into the odd subspace (FIG. 7C). The phase of the resulting state is pre-set deterministically by choosing the phase of the pulses used to create the superposition. FIGS. 7D and 7E characterize the states $|\Psi^+\rangle$ and $|\Psi^-\rangle$ by measuring correlations in different bases. From these results a lower bound is determined for the state fidelity of 91±1% and 90±1%, respectively [B. B. Blinov et al., Nature 428, 153 (2004)]. These results are consistent with the value obtained from full tomography (FIG. 6E), and confirm the universal nature of the scheme described herein.

Furthermore, results indicate how the parity measurement can be used to construct a non-destructive Bell-state analyzer [C. W. J. Beenakker et al., Phys. Rev. Lett. 93, 020501 (2004); R. Ionicioiu, Phys. Rev. A 75, 032339 (2007)]. Although $|\Psi^+\rangle$ and $|\Psi^-\rangle$ show identical odd correlations (FIG. 7D), they can be distinguished by a second parity measurement after a basis rotation (FIG. 7E). The first parity measurement then determines the parity of the state ($|\Psi\rangle$ or $|\Phi\rangle$), whereas the second parity measurement determines the phase ('+' or '−') [R. Ionicioiu, Phys. Rev. A 75, 032339 (2007)].

The measurement scheme has been tested through Bell's inequalities in CHSH form. This experiment places high demands on both the fidelity of the entangled state and on its readout [M. Ansmann et al., Nature 461, 504 (2009)], and therefore provides a useful benchmark for implementations of measurement-based quantum computing. Post selection is not employed. Rather, it is confirmed before the procedure that the NV center is in its negative charge state [G. Waldherr et al., Phys. Rev. Lett. 106, 157601 (2011)] and that the optical transitions are resonant with the readout and pump laser [L. Robledo et al., Nature 477, 574 (2011)]. Furthermore, the read-out protocol is adapted to obtain a single-shot measurement of the complete two-qubit state (FIG. 8A), and therefore does not rely on a fair-sampling assumption [M. A. Rowe et al., Nature 409, 791 (2001); M. Ansmann et al., Nature 461, 504 (2009)].

Each of the four Bell states $|\Psi^\pm\rangle$ and $|\Phi^\pm\rangle$ are created and the correlation function $E(\phi,\theta)=P_{\phi,\theta}(00)+P_{\phi,\theta}(11)-P_{\phi,\theta}(01)-P_{\phi,\theta}(10)$ is measured for all combinations of the Bell angles $$\phi = \left\{\frac{\pi}{4}, \frac{3\pi}{4}\right\}, \theta = \left\{0, \frac{\pi}{2}\right\}.$$

Figure 8:
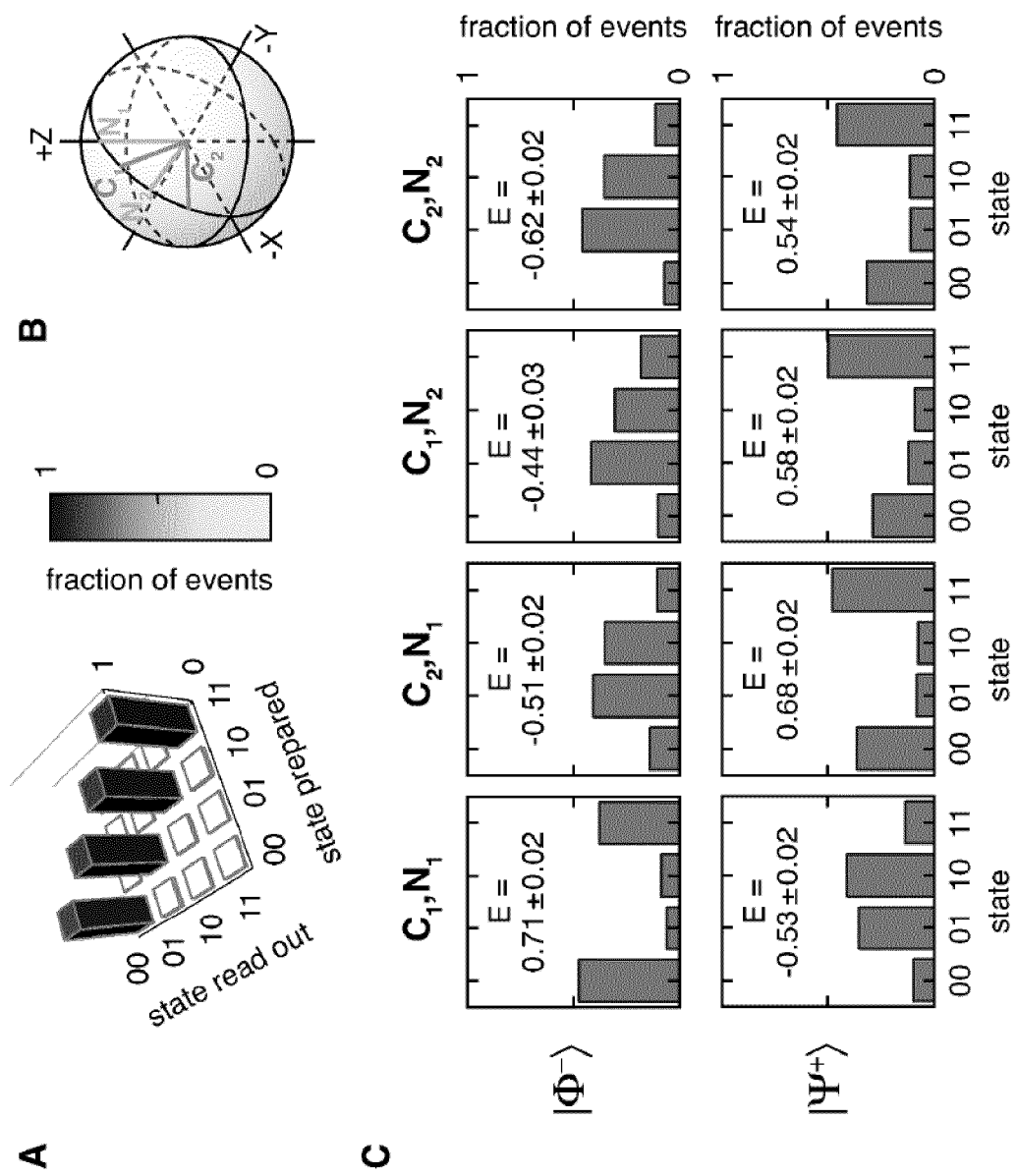
FIG. 8(a) illustrates characterization of the readout used comprising preparing each of the four eigenstates of the two-qubit state and performing a single shot readout of the two-qubit correlations; the readout fidelities for the states 00, 01, 10 and 11 are 90.0±0.9%, 92.3±0.9%, 92.6±0.8%, and 95.2±0.7%, respectively.
FIG. 8(b) illustrates that for all four Bell states, S is measured using a set of bases for which a maximum of |S| is expected; the bases correspond to rotating the 14N qubit by {0, pi/2}, and the 13C qubit by {pi/4, 3pi/4}, both around +Y.
FIG. 8(c) illustrates histograms of the four single-shot measurements for |Φ⁻⟩ (300 repetitions per measurement) and |Ψ⁺⟩ (500 repetitions); the resulting values for |S| are 2.28±0.05 and 2.33±0.04, respectively.

$P_{\phi,\theta}(X)$ is the probability to measure state X after rotation of the 13C and 14N qubits around the Y-axis by angles phi and theta, respectively (FIG. 8B). A violation of the CHSH inequality for all four Bell states is observed by at least 4 standard deviations, with a mean of $<|S|>=2.30+/-0.05$.

The obtained values for S are lower than the theoretical value of $2\sqrt{2}$ due to errors in the prepared Bell state and due to the finite fidelity of the single-shot read-out. In both cases, the main errors arise from imperfections in the microwave pulses that control the ancilla. Based on the separate characterization of the created Bell states (FIG. 6E) and of the read-out (FIG. 8A) we expect $S=2.31\pm0.09$, in agreement with the experimental result. For a perfect, or calibrated, readout, a value of $S=2.5\pm0.1$ would be obtained.

In the protocol implemented here, the Bell-state generation is heralded; success probability is traded for a high fidelity non-destructive measurement for one of the two outcomes. This limitation is neither fundamental nor inherent to the measurement scheme. Instead, it is imposed because random flips of the electron spin during prolonged readout cause dephasing of the nuclear spin states. Therefore, further improvement of the electron readout, for instance by increasing the detected number of photons [I. Aharonovich et al., Nature Photon. 5, 397-405 (2011)] or by suppressing spin flips, can enable deterministic entanglement generation.

In conclusion, the entanglement of two non-interacting solid state qubits has been demonstrated through a non-destructive parity measurement. The measurement-based protocols implemented here can be extended to include entanglement between remote nuclear spin registers to enable scalable quantum computation [S. Olmschenk et al., Science 323, 486 (2009); E. Togan et al., Nature 466, 730 (2010); H. Bernien et al., Phys. Rev. Lett. 108, 043604 (2012); A. Sipahigil et al., arXiv:1112.3975v1]. The projective parity measurement is a key element of basic quantum error correction protocols. The demonstrated results therefore bring the paradigm-shifting concept of measurement-based quantum computing one step closer to realization in the solid state.

Work relating to this invention has been supported by the Dutch Organization for Fundamental Research on Matter (FOM), the Netherlands Organization for Scientific Research (NWO) and the European DIAMANT program. The inventors also acknowledge support from Element Six Limited and Delft University of Technology.

While this invention has been particularly shown and described with reference to preferred embodiments, it will be understood to those skilled in the art that various changes in form and detail may be made without departing from the scope of the invention as defined by the appandant claims.

The invention claimed is:

1. A device for achieving multi-photon interference, said device comprising:
   at least two solid state photon emitters, each solid state photon emitter comprising nuclear and electron spin states coupled together, each solid state photon emitter being configured to produce photon emission comprising a photon emission peak, wherein the photon emission peaks from different solid state photon emitters have a first frequency difference between peak intensities, and wherein the electron spin states of each solid state photon emitter are resolvable;
   an excitation arrangement configured to individually address the at least two solid state photon emitters;
   a plurality of optical outcoupling structures wherein each solid state photon emitter is provided with an associated optical outcoupling structure;
   a tuning arrangement configured to reduce the first frequency difference between the peak intensities of the photon emission peaks from the at least two solid state photon emitters to a second frequency difference which is smaller than the first frequency difference;
   a photon interference arrangement configured to overlap photon emissions from the at least two solid state emitters after tuning; and
   a detector arrangement configured to detect photon emissions from the at least two solid state emitters after tuning and passing through the photon interference arrangement, wherein the detector arrangement is configured to resolve sufficiently small differences in photon detection times such that tuned photon emissions from the at least two solid state emitters are quantum mechanically indistinguishable resulting in quantum interference between indistinguishable photon emissions from different solid state photon emitters;
   wherein the at least two solid state photon emitters are formed by photon emissive defects in a diamond material, and
   wherein the photon emissive defects are nitrogen vacancy (NV) defects.

2. A device according to claim 1, wherein each photon emission peak has a bandwidth which is no more than a factor of 100, 80, 60, 40, 20, 10, 5, or 1 times a natural linewidth of its associated solid state emitter.

3. A device according to claim 1, wherein the first frequency difference between two photon emission peaks from different solid state photon emitters is no more than a factor of 10000, 5000, 3000, 1000, 750, or 500 times a natural line width of each of the two photon emission peaks.

4. A device according to claim 1, wherein the second frequency difference between two photon emission peaks from different solid state photon emitters after tuning is no more than a factor of 100, 75, 50, 25, 10, 5, or 1 times a natural line width of each of the two photon emission peaks.

5. A device according to claim 1, wherein the detector is configured to resolve differences in photon detection times smaller than: 1/(a natural linewidth of each solid state photon emitter); 10/(200 times a natural linewidth of each solid state photon emitter); 1/(200 times a natural linewidth of each solid state photon emitter); 1/(500 times a natural linewidth of each solid state photon emitter); 1/(1000 times a natural linewidth of each solid state photon emitter); or 1/(2000 times a natural linewidth of each solid state photon emitter).

6. A device according to claim 1, wherein the detector has a frequency resolution in a range 0.1 to 25 GHz, 0.5 to 20 GHz, 1 to 15 GHz, 1 to 10 GHz, or 1 to 5 GHz.

7. A device according to claim 1, wherein each solid state photon emitter is configured to produce photon emission having a larger bandwidth than its associated photon emission peak, the quantum interference device further comprising a filtering arrangement configured to reduce the bandwidth of photon emission from each solid state photon emitter by filtering out photons not associated with the photon emission peak of each solid state photon emitter.

8. A device according to claim 7, wherein the filtering arrangement is configured whereby after filtering the photon emission from each solid state photon emitter has a bandwidth which is no more than a factor of 100, 80, 60, 40, 20, 10, 5, or 1 times a natural linewidth of its associated solid state emitter.

9. A device according to claim 7, wherein the filtering arrangement comprises a filtering element configured to separate a zero phonon line emission from a phonon side band emission.

10. A device according to claim 9, further comprising a detector configured to measure the separated phonon side band emission and an adjustment configuration for realigning and/or refocusing components of the quantum processing device if a reduction in intensity of the phonon side band emission is detected to thereby increase the intensity of the phonon side band emission.

11. A device according to claim 1, wherein the quantum processing device further comprises a polarization filtering arrangement configured to selectively filter photons of a common polarization.

12. A device according claim 1, wherein the photon emissive defects are preferentially oriented relative to a crystallographic orientation of the diamond material.

13. A device according to claim 12, wherein the diamond material is oriented in a {111} crystallographic orientation and the photon emissive defects each have dipoles corresponding to $E_x$ and $E_y$ transitions lying in a surface plane and orthogonal to each other.

14. A device according to claim 1, wherein the excitation arrangement is configured to adjust polarization of the excitation to selectively excite $E_x$ or $E_y$ emission.

15. A device according to claim 1, wherein the tuning arrangement is configured to apply an electric field to one or more of the at least two solid state photon emitters to compensate for frequency differences between the at least two solid state photon emitters and bring the photon emission peaks into resonance.

16. A device according to claim 11, wherein the polarization filtering arrangement is configured to compensate for changes in dipole orientation as a result of the applied electric field of the tuning arrangement.

17. A device according to claim 1, wherein a switching device is provided to alter emission modes between parallel and orthogonal polarization.

18. A device according to claim 1, comprising a time resolved multi-photon interference contrast no less than 50%, 60%, 65%, 70% or 75%.

* * * * *